United States Patent
Shimizu et al.

(10) Patent No.: US 7,271,595 B2
(45) Date of Patent: Sep. 18, 2007

(54) SENSOR DETECTION APPARATUS AND SENSOR

(75) Inventors: Katsuya Shimizu, Kasugai (JP); Hiroyuki Sakima, Kasugai (JP); Takahiro Watai, Kasugai (JP); Masaya Mizutani, Kasugai (JP); Koju Aoki, Kasugai (JP); Koji Takekawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/362,098

(22) Filed: Feb. 27, 2006

(65) Prior Publication Data

US 2007/0115005 A1    May 24, 2007

(30) Foreign Application Priority Data

Nov. 21, 2005  (JP) .............................. 2005-336278

(51) Int. Cl.
*G01R 31/08* (2006.01)
(52) U.S. Cl. ...................................... 324/522; 324/526
(58) Field of Classification Search ................ 324/526, 324/522; 73/1.38
See application file for complete search history.

(56) References Cited

U.S. PATENT DOCUMENTS 4,063,447 A * 12/1977 Mathison ..................... 73/23.4
5,521,492 A * 5/1996 Egami ........................ 324/130
5,612,488 A * 3/1997 Yamamoto et al. .......... 73/1.38
5,726,564 A * 3/1998 Takashima ................... 323/367
6,452,151 B1 * 9/2002 Tamagawa ................ 250/208.1

FOREIGN PATENT DOCUMENTS

| JP | 4-109371 U | 9/1992 |
|---|---|---|
| JP | 5-81720 U | 11/1993 |
| JP | 6-229778 A | 8/1994 |
| JP | 2003-194646 A | 7/2003 |

* cited by examiner

*Primary Examiner*—Walter Benson
*Assistant Examiner*—Amy He
(74) *Attorney, Agent, or Firm*—Arent Fox, LLP.

(57) ABSTRACT

Provided are two monitor circuits for monitoring two input signals of an input stage differential amplifier, respectively, and two monitor circuit for monitoring two output signals of the input stage differential amplifier, respectively. When failure occurs at the bridge circuit of a sensor element or at the input stage differential amplifier, the monitoring units or the monitoring units detect abnormality, which makes it possible to detect the failure of the sensor element or the input stage differential amplifier. Therefore it is possible to detect failure such as a disconnection or a short circuit of the bridge circuit of the sensor element and failure which has occurred at the amplifier for amplifying outputs of the sensor element.

20 Claims, 15 Drawing Sheets

F I G. 5
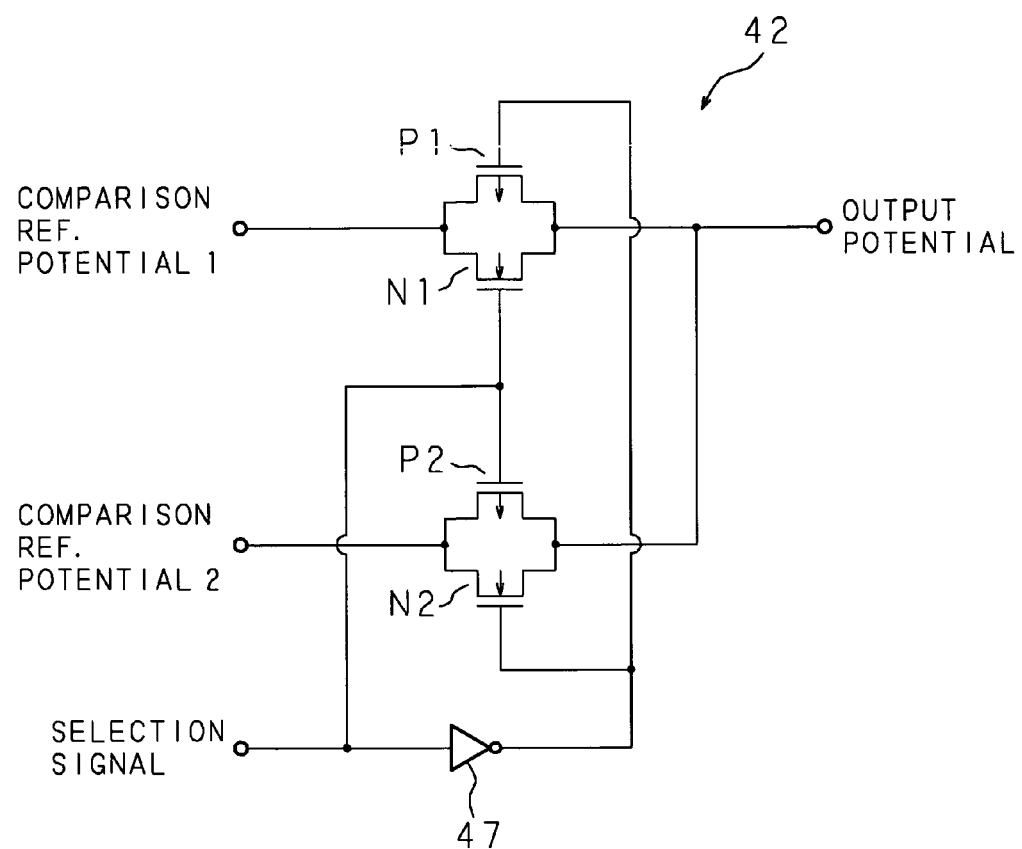

FIG. 7A DRIVING SIGNAL
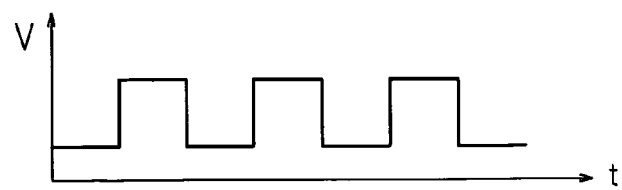
FIG. 7B Va
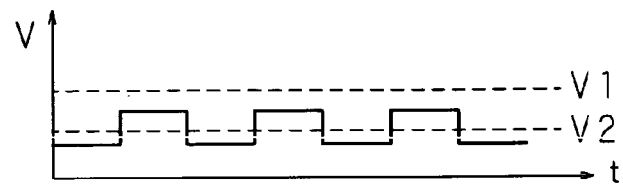
FIG. 7C Vb
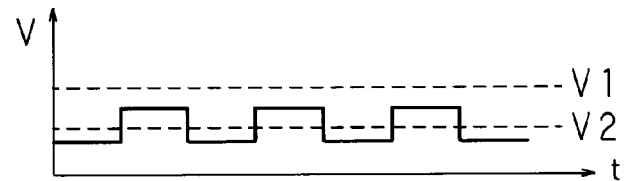
FIG. 7D Vc
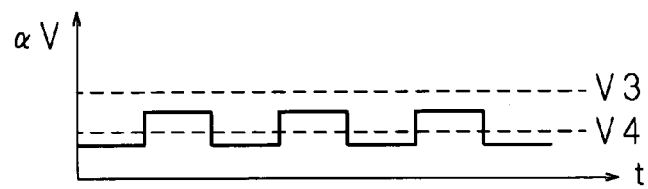
FIG. 7E Vd
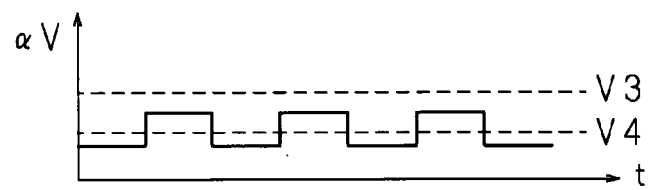
FIG. 7F Vz
FIG. 7G SENSOR OUTPUT SIGNAL
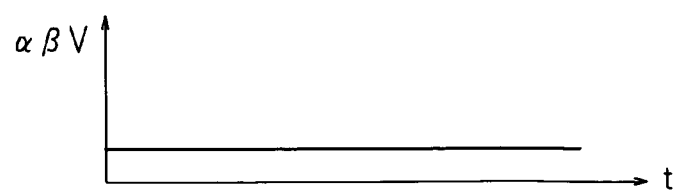

F I G. 8A DRIVING SIGNAL
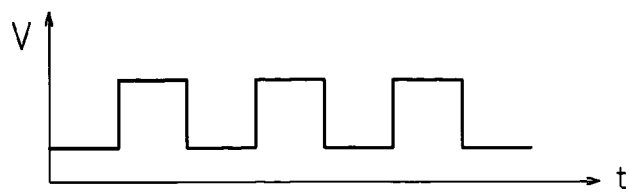
F I G. 8B Va
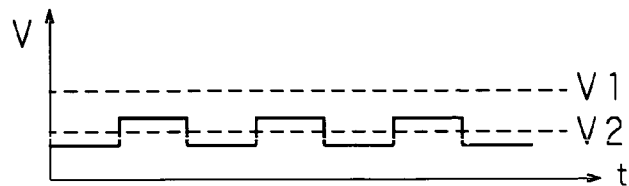
F I G. 8C Vb
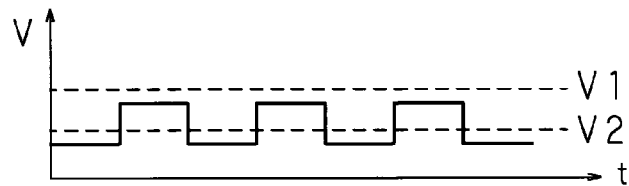
F I G. 8D Vc
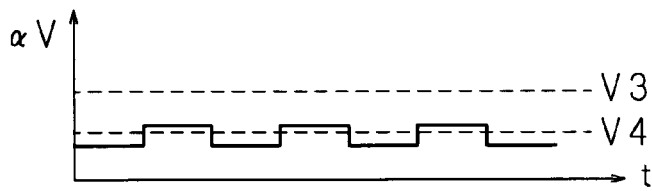
F I G. 8E Vd
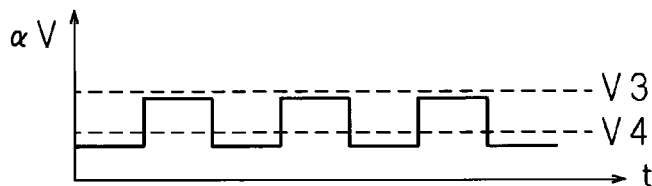
F I G. 8F Vz
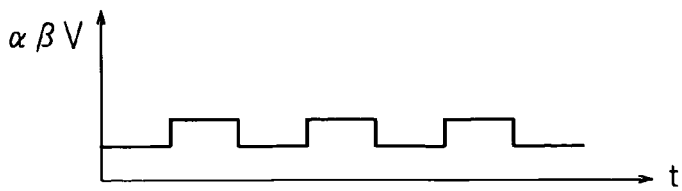
F I G. 8G SENSOR OUTPUT SIGNAL

FIG. 9A DRIVING SIGNAL
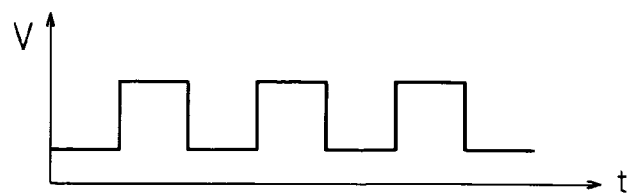
FIG. 9B Va
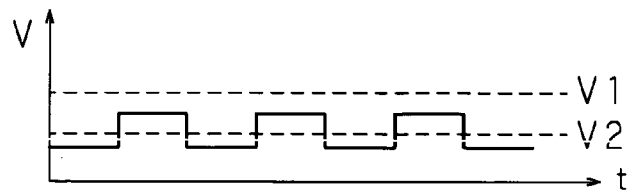
FIG. 9C Vb
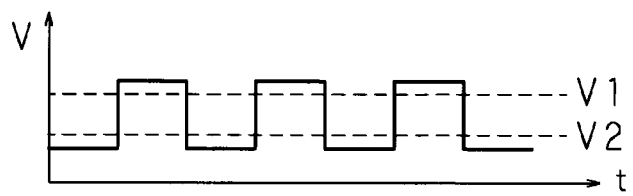
FIG. 9D Vc
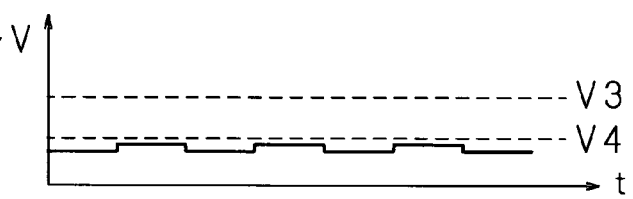
FIG. 9E Vd
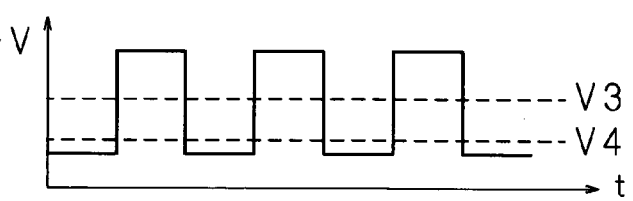
FIG. 9F Vz
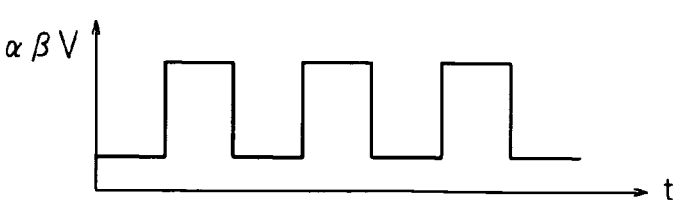
FIG. 9G SENSOR OUTPUT SIGNAL
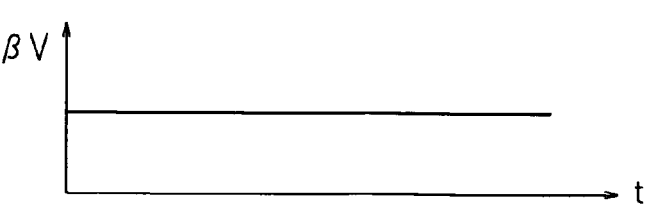

FIG. 10A DRIVING SIGNAL
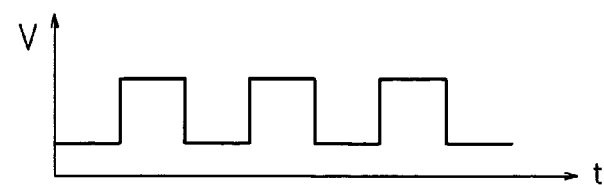
FIG. 10B Va
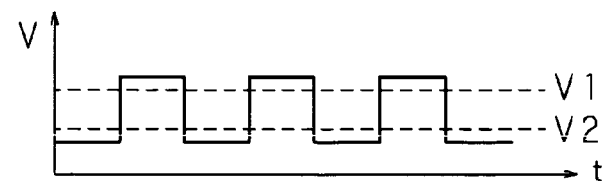
FIG. 10C Vb
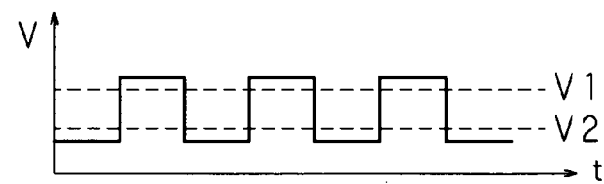
FIG. 10D Vc
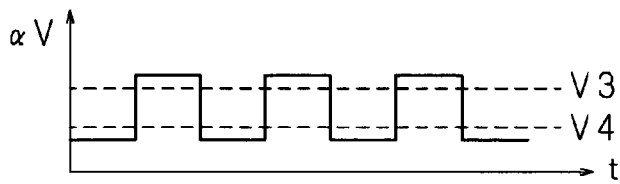
FIG. 10E Vd
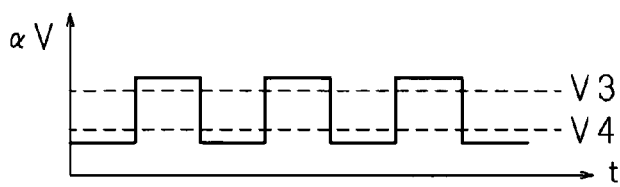
FIG. 10F Vz
FIG. 10G SENSOR OUTPUT SIGNAL

FIG. 11A DRIVING SIGNAL
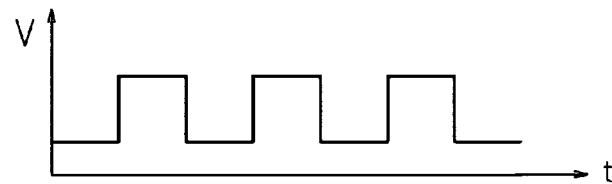
FIG. 11B Va
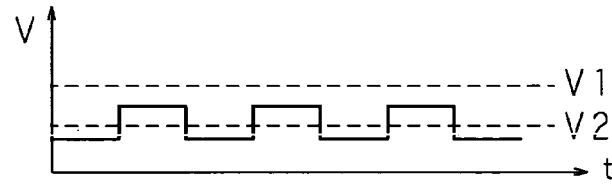
FIG. 11C Vb
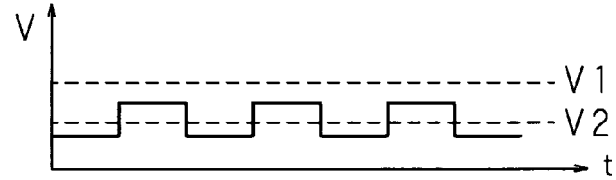
FIG. 11D Vc
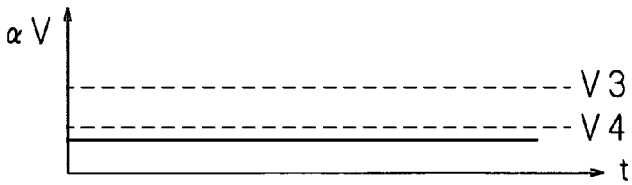
FIG. 11E Vd
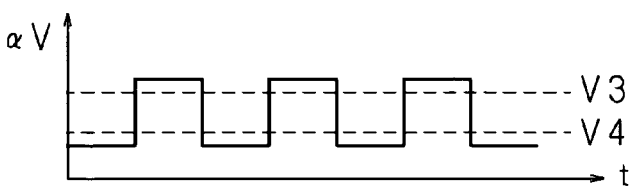
FIG. 11F Vz
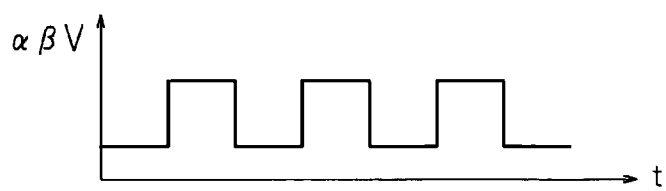
FIG. 11G SENSOR OUTPUT SIGNAL
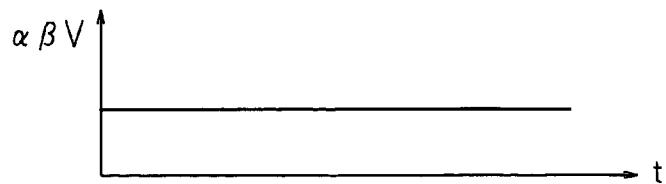

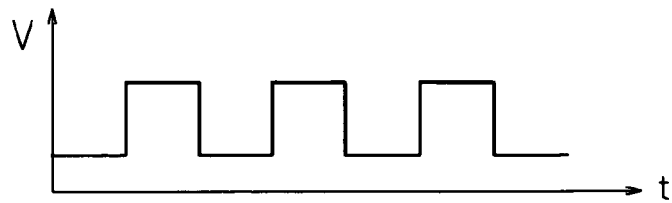
FIG. 12A DRIVING SIGNAL
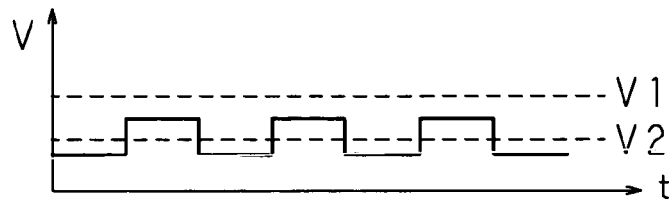
FIG. 12B Va
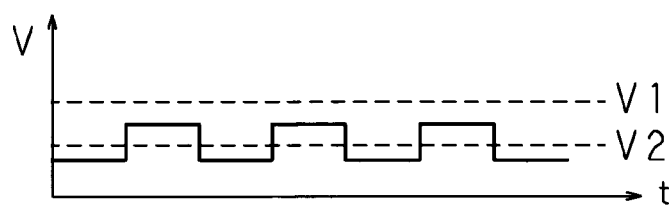
FIG. 12C Vb
FIG. 12D Vc
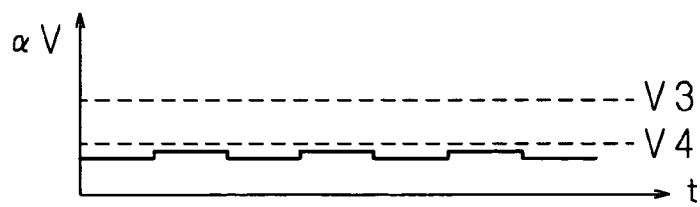
FIG. 12E Vd
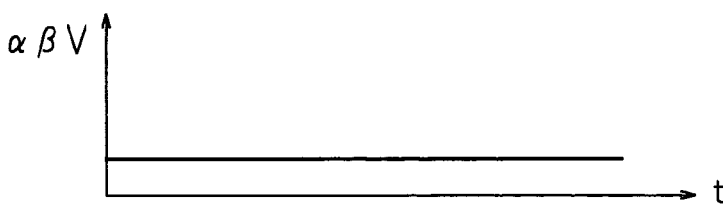
FIG. 12F Vz
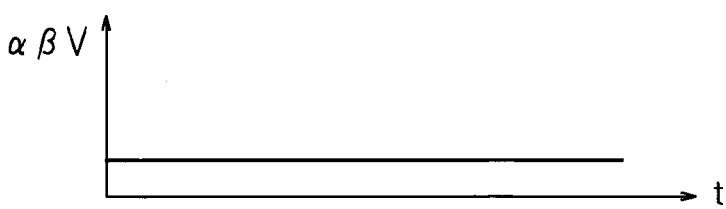
FIG. 12G SENSOR OUTPUT SIGNAL

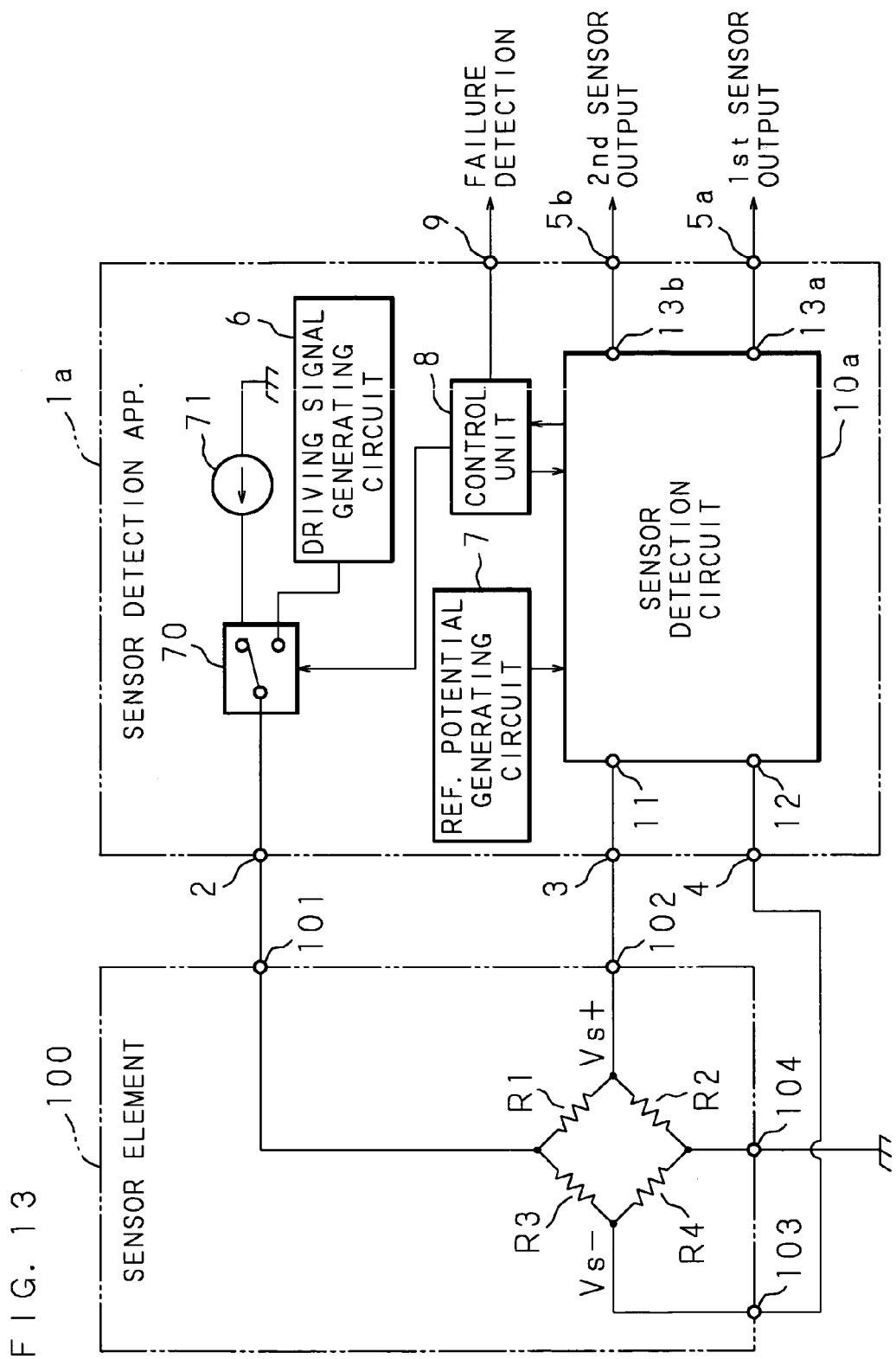

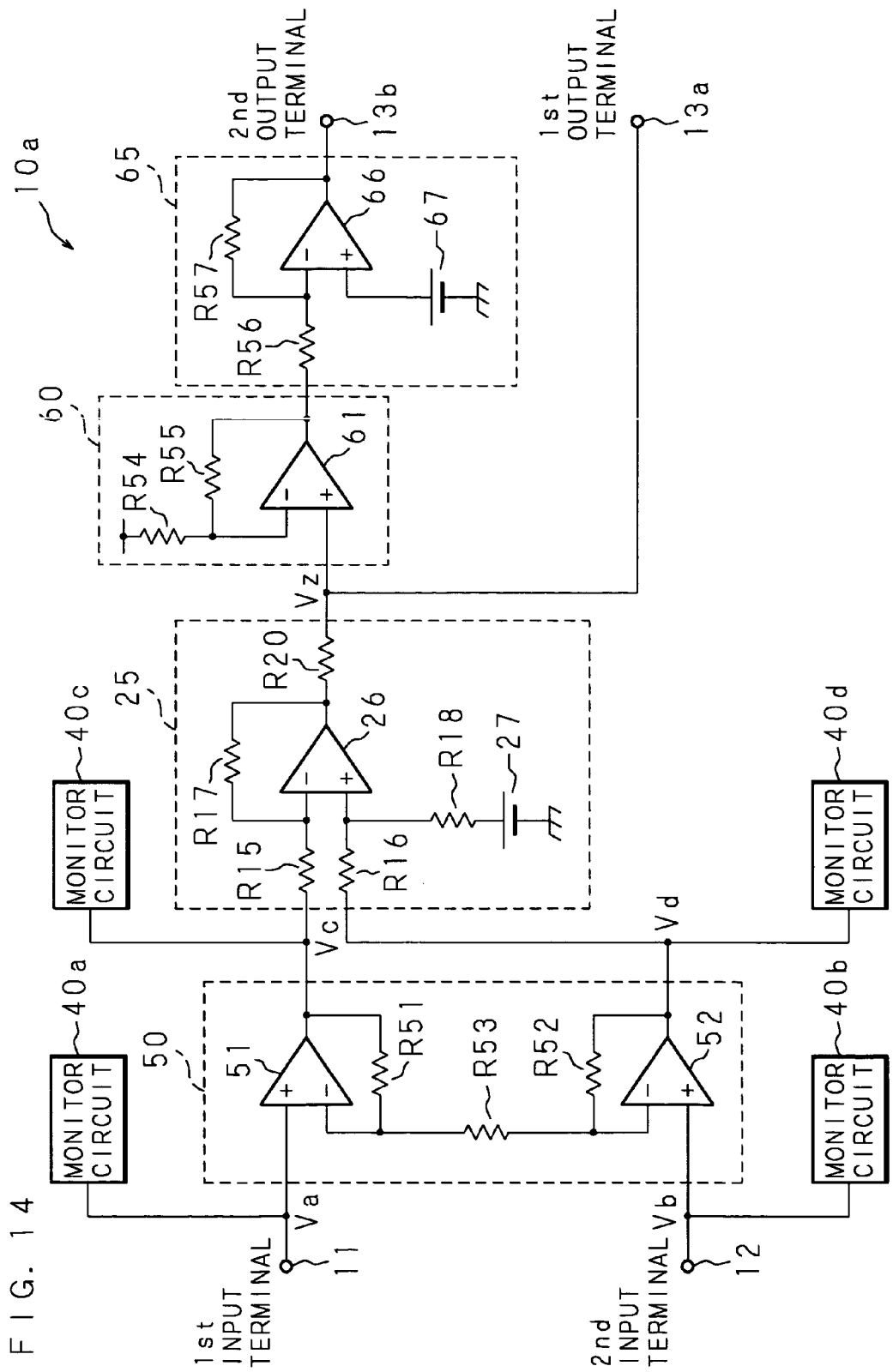

SENSOR DETECTION APPARATUS AND SENSOR

CROSS-REFERENCE TO RELATED APPLICATIONS

This Nonprovisional application claims priority under 35 U.S.C. § 119(a) on Patent Application No. 2005-336278 filed in Japan on Nov. 21, 2005, the entire contents of which are hereby incorporated by reference.

BACKGROUND OF THE INVENTION

1. Field of the Invention

The present invention relates to a sensor detection apparatus having a sensor detection circuit capable of detecting abnormality of a sensor element which uses bridge circuits and to a sensor provided with such a sensor detection apparatus.

2. Description of Related Art

FIG. 1 is a circuit diagram showing a configuration of a conventional acceleration sensor. In FIG. 1, reference numeral 100 denotes a sensor element which senses acceleration and reference numeral 110 denotes a sensor detection apparatus which detects the acceleration from an output of the sensor element 100. In the sensor element 100, four piezoresistors R1, R2, R3, and R4 whose resistance values vary according to pressure applied to themselves, form a Wheatstone bridge circuit. The piezoresistors R1 an R2 in series and the piezoresistors R3 and R4 in series are connected in parallel between a power source terminal 101 to which a driving power source is given, and a grounding terminal 104 connected to a ground potential. As outputs of the sensor element 100, a potential Vs+ between the piezoresistors R1 and R2 is outputted from a first output terminal 102 and a potential Vs− between the piezoresistors R3 and R4 is outputted from a second output terminal 103.

In a case where it is assumed that the piezoresistors R1, R2, R3, and R4 each have a resistance value of R, the potentials Vs+ and Vs− are equal when no acceleration is applied to the sensor element 100. However, when acceleration is applied, for example, the resistance values of the piezoresistors R1 and R4 on the diagonal position vary to R+ΔR and those of the piezoresistors R2 and R3 on the diagonal position as well vary to R−ΔR. As a result, a potential difference corresponding to ΔR is developed between the potentials Vs+ and Vs−.

The sensor detection apparatus 110 is provided with a power circuit 115 for driving the sensor element 100. The output of the power circuit 115 is outputted from a power output terminal 111, and given to the power terminal 101 of the sensor element 100. The two potentials Vs+ and Vs− of the sensor element 100 are inputted to an amplifier 116 in the sensor detection apparatus 110 via a first input terminal 112 and a second input terminal 113 of the sensor detection apparatus 110, respectively. The amplifier 116 amplifies the potential difference between the potentials Vs+ and Vs− and then outputs a result from an output terminal 114. Acceleration applied to the sensor element 100 can be judged based on the output from the output terminal 114.

In Japanese Utility Model Application Laid-Open No. 4-109371 (1992), a diagnostic circuit has been proposed which is able to detect failure such as a disconnection or a short circuit having occurred at a Wheatstone bridge circuit by monitoring whether two output potentials of the Wheatstone bridge circuit fall within a certain potential range with use of a window comparator. For example, when a disconnection has occurred at the Wheatstone bridge circuit, the output potentials become a power supply potential or a ground potential, so that the abnormality can be detected by the window comparator.

Also, in Japanese Utility Model Application Laid-Open No. 5-81720 (1993), a failure detection apparatus has been propose which is able to detect failure such as a disconnection or a short circuit having occurred at a Wheatstone bridge circuit by monitoring whether a potential difference between both ends of a failure detecting resistor, which is connected in parallel to the Wheatstone bridge circuit, falls within a certain range with use of a window comparator.

In Japanese Patent Application Laid-Open No. 2003-194646, a pressure measuring apparatus has been proposed which is able to reduce the effect of a transient phenomenon of a variation in the output of a Wheatstone bridge circuit and, therefore, increase detection accuracy by applying a pulse voltage to the Wheatstone bridge circuit as a power supply, sampling potential differences between two output voltages at constant time period intervals for measurement, and outputting measured values whose variation has decreased below a threshold value as the result of the measurement.

However, in a diagnostic circuit described in Japanese Utility Model Application Laid-Open No. 4-109371 (1992) and a failure detection apparatus described in Japanese Utility Model Application Laid-Open No. 5-81720 (1993), it is possible to detect a failure such as a disconnection or a short circuit which has occurred at a Wheatstone bridge circuit; however, there is the problem that it is impossible to detect a failure occurred at an amplifier which amplifies a potential difference between two outputs of the Wheatstone bridge circuit.

In particular, when an acceleration sensor and a sensor detection apparatus are comprised of different chips, an amplifier of the input stage of the sensor detection apparatus may break due to static electricity which enters at the input terminal of the IC of the sensor detection apparatus. When the amplifier has broken, it becomes impossible to correctly perform the detection of acceleration; therefore it is desirable that a configuration be provided in which a sensor detection circuit is able to detect the break in the amplifier.

Besides, since the potential difference between the two outputs of the Wheatstone bridge circuit is minute, noise brings about much effect. Therefore there is the problem that the accuracy in the detection deteriorates due to the noise. Moreover, as the amplifier which amplifies the potential difference, high-gain amplifiers are used often. Because of this, the offset of the amplifiers becomes larger, so that there is the problem that accuracy in the detection deteriorates. Japanese Utility Model Application Laid-Open No. 4-109371 (1992), Japanese Utility Model Application Laid-Open No. 5-81720 (1993), and Japanese Patent Application Laid-Open No. 2003-194646 do not refer to these problems.

BRIEF SUMMARY OF THE INVENTION

The present invention has been made in view of such problems and hence, an object of the invention is to provide a sensor detection apparatus capable of detecting the failure such as a disconnection or a short circuit of the bridge circuit of a sensor element and the break of a differential amplifying unit by adopting a configuration in which monitoring units are provided for monitoring the potentials of the input and output signals of the differential amplifying unit which amplifies a potential difference between two input signals given from the sensor element having the bridge circuit.

Another object of the invention is to provide a sensor detection apparatus capable of detecting the failure such as a disconnection or a short circuit of the bridge circuit and the break of the differential amplifying unit with reliability by adopting a configuration in which monitoring units are provided for monitoring two input signals inputted to the differential amplifying unit and two output signals outputted from the differential amplifying unit, respectively.

Another object of the invention is to provide a sensor detection apparatus capable of detecting the state of the sensor element with higher reliability by adopting a configuration in which an output stage differential amplifying unit is provided for further amplifying a potential difference between the two output signals of the differential amplifying unit amplifying a potential difference between the two input signals given from the sensor element, and outputs an amplified result.

Another object of the invention is to provide a sensor detection apparatus which requires no additional device provided with driving means by adopting a configuration in which driving means is provided to drive the sensor element.

Another object of the invention is to provide a sensor detection apparatus capable of detecting failure by monitoring variations in potentials at the monitoring units, detecting the state of the sensor element concurrently with, and reducing a malfunction resulting from noise by adopting a configuration in which the sensor element is driven by using a periodically changing signal such as a sine wave signal or a pulse signal and conversion outputting means is provided for converting the periodically changing signal to a direct-current signal and outputs the signal.

Another object of the invention is to provide a sensor detection apparatus capable of detecting failure by monitoring variations in potentials at the monitoring units through the use of a periodically changing signal and detecting the state of the sensor element by using a direct-current signal by adopting a configuration in which the sensor element is driven by the periodically changing signal or the direct-current signal.

Another object of the invention is to provide a sensor detection apparatus capable of checking whether a driving signal given to the bridge circuit of the sensor element is correctly transmitted to the individual monitoring points at the comparators and the counters and of detecting the failure easily by adopting a configuration in which the sensor element is driven by using the periodically changing signal, comparing the potentials of monitoring points and reference potentials at comparators, and counting comparison results brought by the comparators at counters.

Another object of the invention is to provide a sensor detection apparatus capable of detecting more various failures by adopting a configuration in which the comparators compare the plural reference potentials and the potentials of the monitoring points.

Another object of the invention is to provide a sensor detection apparatus capable of reducing a gain on direct-current components of the two input signals of the differential amplifying unit, obtaining two output signals whose alternating-current components alone have been amplified, and reducing the influence of offsets which are the direct-current components of the two operational amplifiers of the differential amplifying unit by adopting configuration in which the two operational amplifiers are connected with each other via a capacitor.

Another object of the invention is to provide a sensor detection apparatus capable of cutting off the direct-current components and the low-frequency components of the differential outputs given to the differential amplifying unit, amplifying their high-frequency components alone, and reducing the effect of 1/f noises of the operational amplifiers by adopting a configuration in which the outputs from the bridge circuit of the sensor element are given to the differential amplifying unit via filters when, for example, high-pass filters are used as the filters.

Another object of the invention is to provide a reliable sensor by providing the sensor detection apparatus capable of detecting the failures of the sensor element and the amplifying units.

A first aspect of the sensor detection apparatus according to the invention is a sensor detection apparatus for detecting a state of a sensor element having a bridge circuit based on a potential difference between two output potentials of the bridge circuit outputted from the sensor element, and is characterized by comprising: a first input terminal and a second input terminal to which the two output potentials outputted from the sensor element are inputted, respectively; a differential amplifying unit which amplifies the potentials of the input signals inputted to the first input terminal and the second input terminal, respectively, and outputs amplified results; monitoring unit for monitoring the potential of the input signal of the differential amplifying unit, and monitoring unit for monitoring the potential of the output signal of the differential amplifying unit, and a control unit which detects the state of the sensor element based on monitor result by the monitoring unit.

In the first aspect of the sensor detection apparatus according to the invention, the monitoring unit is provided for monitoring the potentials of the input and output signals of the differential amplifying unit, which amplifies a potential difference between two input signals given from the bridge circuit of the sensor element, respectively. When failure occurs at the bridge circuit of the sensor element or the differential amplifying unit, the monitoring units detect abnormality, so that the failure at the sensor element or the differential amplifying unit can be detected.

According to the first aspect of the sensor detection apparatus of the invention, when the failure has occurred at the bridge circuit or differential amplifying unit as described above, the monitoring units can detect the abnormality, which makes it possible to improve the reliability of detection results of acceleration, pressure, or the like obtained by using the sensor.

A second aspect of the sensor detection apparatus according to the invention is characterized in that the differential amplifying unit outputs the two output signals generated by amplifying a potential difference between the two input signals, and the monitoring unit monitor the potentials of the two input signals and the two output signals, respectively.

In the second aspect of the sensor detection apparatus according to the invention, two output signals can be obtained by amplifying a potential difference between two input signals from the sensor element at the differential amplifying unit. The monitor circuit monitors the potentials of the two input signals and the two output signals. When failure has occurred at the sensor element, the abnormalities of the input signals of the differential amplifying unit are detected and when failure has occurred at the differential amplifying unit, the abnormalities of the output signals of the differential amplifying unit are detected.

According to the second aspect of the sensor detection apparatus of the invention, since it is possible to surely detect the failure of the sensor element by monitoring the input signals and to surely detect the failure of the differential amplifying unit by monitoring the output signals as described above, it is possible to improve the reliability of detection result of acceleration, pressure, or the like obtained by using the sensor.

A third aspect of the sensor detection apparatus according to the invention is characterized by further comprising an output stage differential amplifying unit which amplifies a potential difference between the two output signals of the differential amplifying unit, and outputs an amplified result.

In the third aspect of the sensor detection apparatus according to the invention, two output signals are obtained by amplifying a potential difference between two input signals from the sensor element at the differential amplifying unit. Then a potential difference between the two output signals is amplified by the output stage differential amplifying unit, and amplified results are outputted. Since the potential difference between the two input signals from the sensor element is minute, the state of the sensor element can be surely detected by amplifying the potential differences at the amplifying units of the plural stages plural times as described above.

According to the third aspect of the sensor detection apparatus of the invention, since the minute potential difference between the two input signals from the sensor element can be surely amplified as described above, the accuracy of detection of acceleration, pressure, or the like done by the sensor is improved.

A fourth aspect of the sensor detection apparatus according to the invention is characterized by further comprising driving means for generating a driving signal for driving said sensor element.

In the fourth aspect of the sensor detection apparatus according to the invention, the sensor detection apparatus is provided with the driving means for generating a driving signal for driving the sensor element. As a result, a need to provide an additional device having driving means is eliminated. And further, the sensor detection apparatus performs the detection of failure, it becomes possible to change the driving signal.

According to the fourth aspect of the sensor detection apparatus of the invention, since there is no need to provide the additional device having the driving means as described above, the production cost of the sensor can be reduced. In addition, since it becomes possible to control the change of the driving signal in the sensor detection apparatus, it is possible to use the different driving signals in cases where the state of the sensor is detected and the detection of failure is performed, which makes it possible to perform the detection of failure according to circuit configurations.

A fifth aspect of the sensor detection apparatus according to the invention is characterized in that the driving means generates the driving signal which changes periodically, and conversion outputting means is provided for converting the periodically changing signal outputted from the output stage differential amplifying unit to a direct-current signal based on the periodically changing signal generated by the driving means, and for outputting the converted signal.

In the fifth aspect of the sensor detection apparatus according to the invention, the sensor element is driven by using a signal which changes periodically. The monitoring unit monitors variations in the potential of the monitoring point to perform the detection of failure. Besides, since the conversion outputting means, which converts the periodically changing signal to a direct-current signal and then outputs the signal, is provided, the detection of failure and the detection of the state of the sensor element can be performed at the same time. In addition, by using the periodically changing signal, a malfunction resulting from noise can be reduced.

According to the fifth aspect of the sensor detection apparatus of the invention, since it is possible to detect the state of the sensor element by using the periodically changing signal and to detect the failure at the monitoring unit from the variation in the potential of the monitoring point as described above, it becomes possible to detect the state of the sensor element and the failure at the same time, which improves the reliability of the sensor further. Furthermore, as described above, the malfunction resulting from the noise can be reduced, thereby the reliability of the sensor is improved further.

A sixth aspect of the sensor detection apparatus according to the invention is characterized in that the driving means generates a periodically changing driving signal or a direct-current driving signal.

In the sixth aspect of the sensor detection apparatus of the invention, the sensor element is driven by the periodically changing signal or the direct-current signal generated by the driving means. For example, when the detection of the failure is performed, the bridge circuit of the sensor element is driven by the driving signal such as the sine wave signal or the pulse signal but when the detection of the failure is not performed, the bridge circuit is driven by the direct-current driving signal. Moreover, since the monitoring unit is connected to the differential amplifying unit, the failure can be detected by operating the monitoring unit when the detection of the failure is performed. Therefore the function of detecting the failure can be realized easily.

According to the sixth aspect of the sensor detection apparatus of the invention, when the detection of the failure is performed, the bridge circuit of the sensor element is driven by the periodically changing signal and when the state of the sensor element is detected, the bridge circuit of the sensor element is driven by the direct-current driving signal as described above and hence, the state of the sensor element can be detected by using the same method as that for conventional sensor detection apparatus. Since this means that the function of detecting the failure can be easily added by adding only the driving signal generating source and the monitoring units to existing circuits, sensor detection apparatus having such a configuration can be designed within a short period and their development cost can be reduced.

A seventh aspect of the sensor detection apparatus according to the invention is characterized in that the monitoring unit includes: a comparator which compares a potential to be monitored and a reference potential and then outputs a signal indicating a comparison result; and a counter which counts the output signal of the comparator; and the control unit detects the state of the sensor element based on count results by the counter.

In the seventh aspect of the sensor detection apparatus according to the invention, the bridge circuit of the sensor element is driven by the periodically changing signal and the comparisons of the potentials of the monitoring points and the predetermined reference potential are made by the comparators. Since pulse signals can be obtained from the outputs of the comparators as the comparison results of the driving signals transmitted from the Wheatstone bridge circuit to the individual monitoring points and the reference potential, the counters count the pulse signal. By comparing the expected values of the count values of the counters, which is determined by the cycles of the driving signal given to the bridge circuit of the sensor element, and the actual count values of the counters, the failure is detected easily.

According to the seventh aspect of the sensor detection apparatus of the invention, since whether the driving signal given to the bridge circuit is correctly transmitted to the individual monitoring points can be checked by the comparators and the counters as described above, it is possible to detect the failure having occurred at the bridge circuit or the differential amplifying unit surely and easily, which improves the reliability of the detection results of acceleration, pressure, or the like obtained by using the sensor.

An eighth aspect of the sensor detection apparatus according to the invention is characterized in that the monitoring unit further includes a selecting unit which selects one of plural different reference potentials, and the comparator compares the potential to be monitored and the reference potential selected by the selecting unit, and output a signal indicating a comparison result.

In the eighth aspect of the sensor detection apparatus according to the invention, by switching plural reference potentials provided and giving the selected reference potential to the comparator, plural comparisons are made. By providing the plural comparison references, it is possible to deal with not only simple failures such as the disconnection or short circuit of the circuit but also various failures such as variations in resistance values resulting from the deterioration of the Wheatstone bridge circuit comprised of piezoresistors or variations in the potentials resulting from a minute amount of current leakage at the circuit.

According to the eighth aspect of the sensor detection apparatus of the invention, since it is possible to deal with not only the simple failures such as the disconnection or short circuit of the circuit but also the various failures such as the variations in the resistance values resulting from the deterioration of the bridge circuit comprised of the piezoresistors or the variations in the potentials resulting from the minute amount of current leakage at the circuit as described above, the reliability is improved further.

A ninth aspect of the sensor detection apparatus according to the invention is characterized in that the differential amplifying unit includes: a first operational amplifier whose non-inverting input is connected with the first input terminal and whose output is connected with whose inverting input via a resistor; and a second operational amplifier whose non-inverting input is connected with the second input terminal and whose output is connected with an inverting input via a resistor; and the inverting input of the first operational amplifier and the inverting input of the second operational amplifier are connected with each other via a capacitor for cutting off the direct-current component.

In the ninth aspect of the sensor detection apparatus according to the invention, the differential amplifying unit is configured by connecting the two operational amplifiers with each other via a capacitor. By adopting such a configuration, a gain on the direct-current components of the two input signals from the bridge circuit of the sensor element is reduced and only their alternating-current components are amplified and outputted, thereby the influence of offsets as the direct-current components at the operational amplifiers is eliminated. Moreover, by adopting such a configuration, the bridge circuit of the sensor element is constantly driven by the driving signal such as the sine wave signal or the pulse signal and in that case, by driving the bridge circuit by using the driving signal with a high frequency, 1/f noises of the operational amplifiers are reduced.

According to the ninth aspect of the sensor detection apparatus of the invention, since it is possible to reduce the influence of the offsets which are the direct-current components at the operational amplifiers as described above, the detection of the acceleration, pressure, or the like can be conducted with higher accuracy. In addition, since 1/f noises of the operational amplifiers can be reduced as described above, the detection of the acceleration, pressure, or the like can be conducted with higher accuracy.

A tenth aspect of the sensor detection apparatus according to the invention is characterized in that the first input terminal and the second input terminal are connected to the differential amplifying unit via a filter which cuts off the specific frequency component of the input signal, respectively.

In the tenth aspect of the sensor detection apparatus according to the invention, the output signals from the bridge circuit of the sensor element are given to the differential amplifying unit through the filters which cut off their specific frequency components. For example, it is possible to cut off the direct-current components and low-frequency components of the input signals by passing the signals through the high-pass filters and give only their high-frequency components to the differential amplifying unit. Since 1/f noises of the operational amplifiers are high in a low-frequency region, the influence of 1/f noises can be reduced by cutting off the direct-current components and the low-frequency components.

According to the tenth aspect of the sensor detection apparatus of the invention, as described above, when, for example, the high-pass filters are used as the filters, the direct-current components and low-frequency components of the outputs given to the differential amplifying unit are cut off and only the high-frequency components are amplified, so that the influence of 1/f noises of the operational amplifiers is reduced. Because of this, it is possible to perform the detection of the acceleration, the pressure, or the like with higher accuracy.

A sensor according to the invention is characterized comprising: the sensor element which has a bridge circuit, and outputs two potentials of the bridge circuit; and the sensor detection apparatus as set forth in any one of first through tenth aspects to which the two potentials outputted by the sensor element are inputted.

In the sensor according to the invention, since the foregoing sensor detection apparatus is provided to the sensor, the failures of the sensor element and the differential amplifying units can be detected and the reliability of the sensor is increased.

According to the sensor of the invention, since the failures of the sensor element and the differential amplifying units can be detected as described above, the reliability of the detection results of the acceleration, the pressure, or the like obtained by using the sensor is improved.

The above and further objects and features of the invention will more fully be apparent from the following detailed description with accompanying drawings.

BRIEF DESCRIPTION OF THE SEVERAL VIEWS OF THE DRAWINGS

FIG. 5 is a circuit diagram showing an example of a configuration of a selection circuit according to the invention;

FIG. 7A to FIG. 7G are schematic waveform charts showing examples of operations of the sensor detection circuit according to the invention;

FIG. 8A to FIG. 8G are schematic waveform charts showing examples of operations effected when acceleration is applied to a sensor element;

FIG. 9A to FIG. 9G are schematic waveform charts showing examples of operations effected when the piezoresistor R4 of the sensor element fails due to disconnection;

FIG. 10A to FIG. 10G are schematic waveform charts showing examples of operations effected when the piezoresistors R2 and R4 of the sensor element fail due to disconnection;

FIG. 11A to FIG. 11G are schematic waveform charts showing examples of operations effected when a failure that the resistor R11 of an input stage differential amplifier short-circuits to a ground potential occurs;

FIG. 12A to FIG. 12G are schematic waveform charts showing examples of operations effected when the resistor R13 of the input stage differential amplifier fails due to disconnection;

FIG. 13 is a circuit diagram showing a configuration of an acceleration sensor according to Embodiment 2 of the invention;

FIG. 14 is a circuit diagram showing a configuration of a sensor detection circuit according to Embodiment 2 of the invention.

DETAILED DESCRIPTION OF THE PRESENT INVENTION

Embodiments according to the present invention will be concretely described below with reference to the drawings.

Embodiment 1

Figure 1:
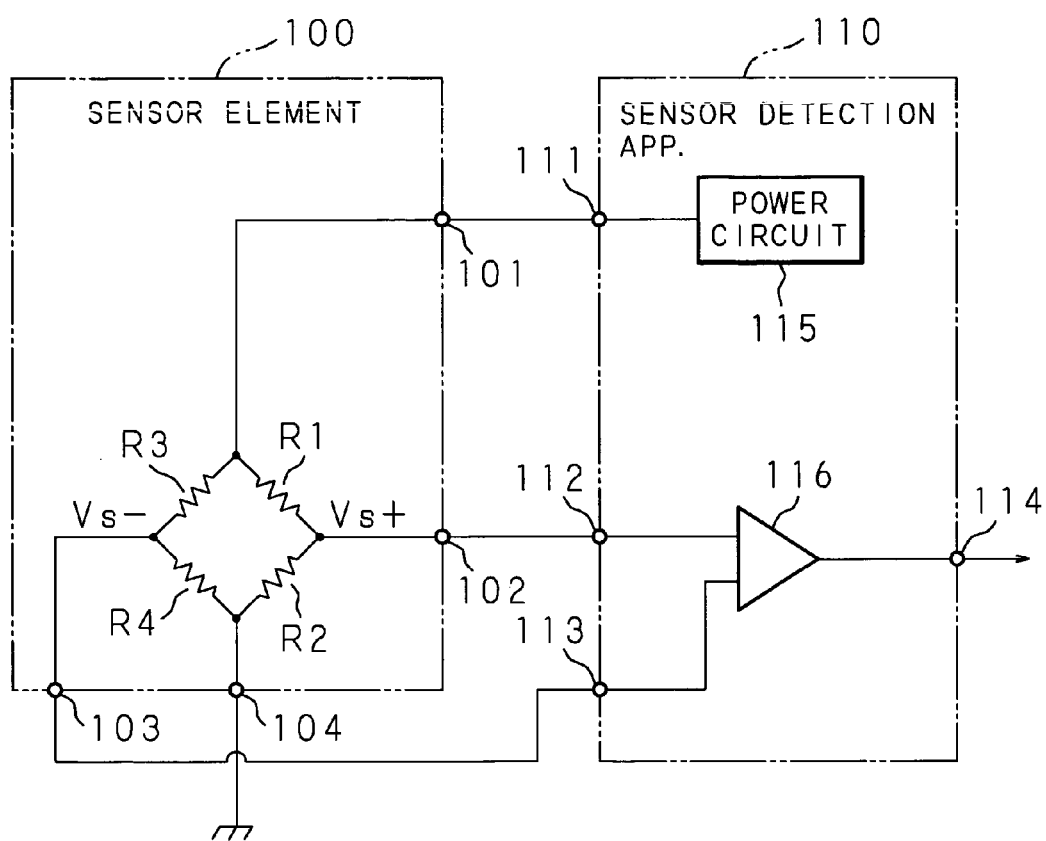
FIG. 1 is a circuit diagram showing a configuration of a conventional acceleration sensor.
Figure 2:
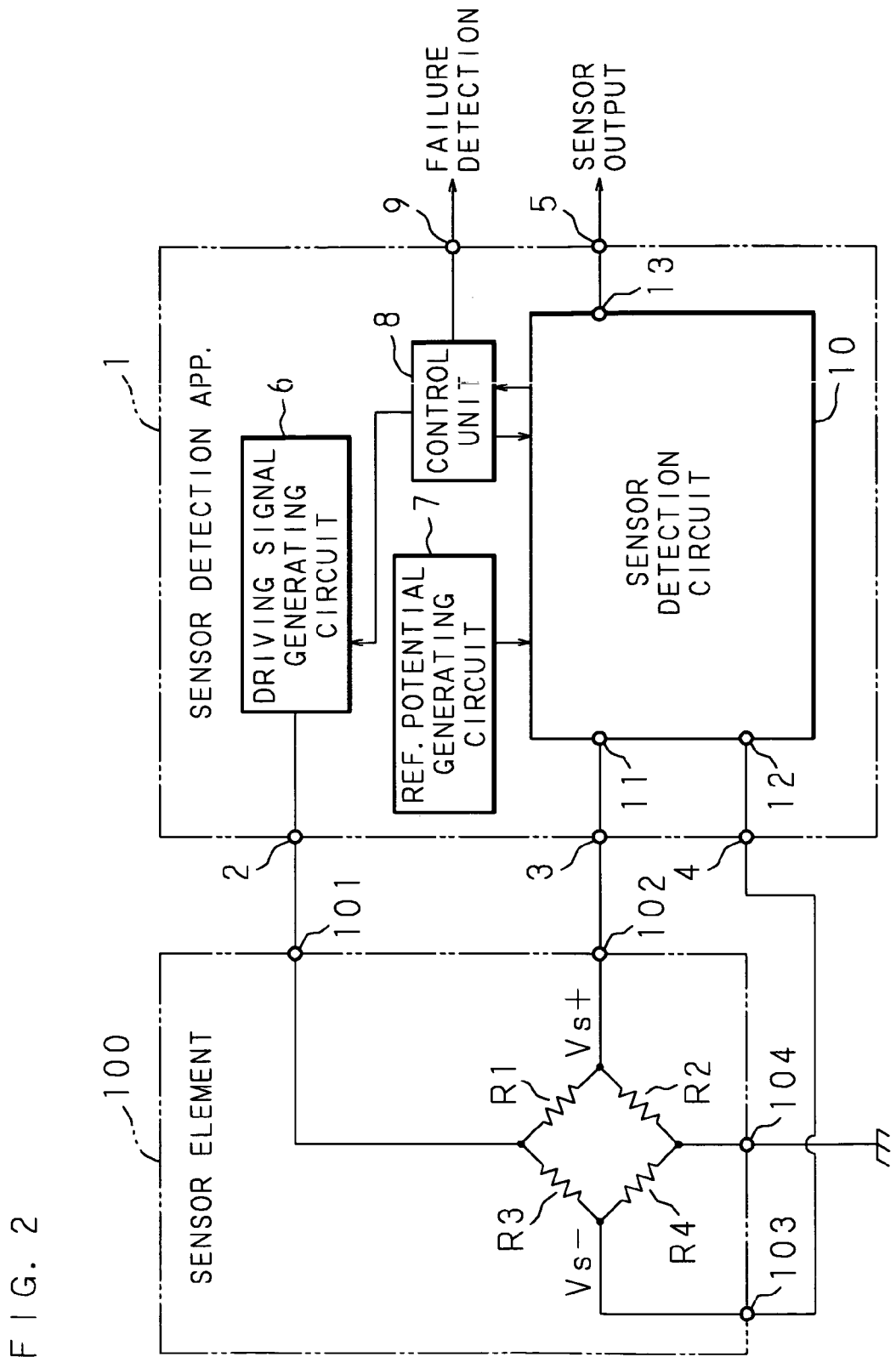
FIG. 2 is a circuit diagram showing a configuration of an acceleration sensor according to Embodiment 1 of the present invention.
Figure 3:
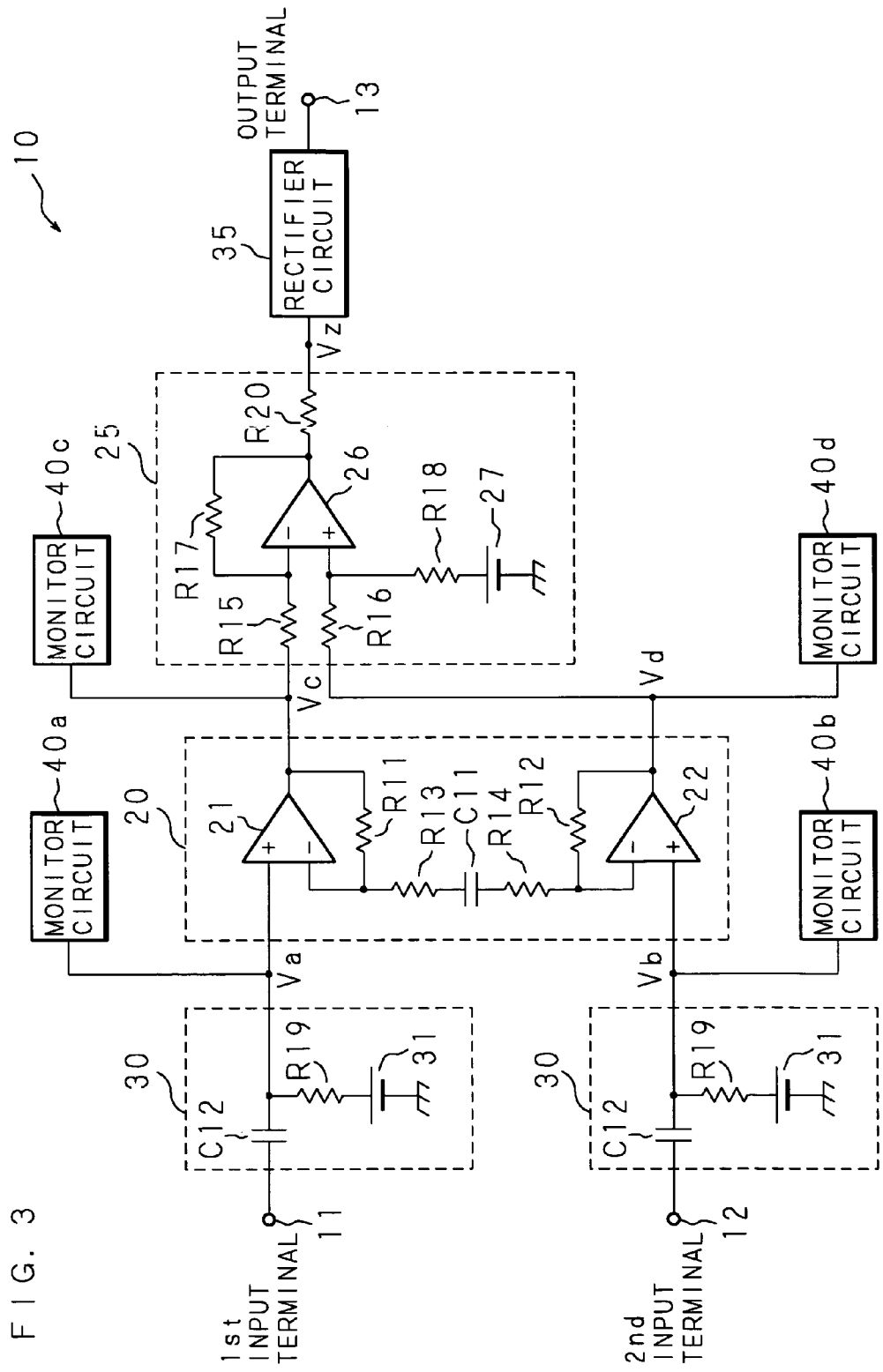
FIG. 3 is a circuit diagram showing a configuration of a sensor detection circuit according to Embodiment 1 of the invention.

FIG. 2 is a circuit diagram showing a configuration of an acceleration sensor according to Embodiment 1 of the invention. The acceleration sensor is comprised of a sensor element 100 and a sensor detection apparatus 1 which detects an acceleration from outputs of the sensor element 100. FIG. 3 is a circuit diagram showing a configuration of a sensor detection circuit 10 included in the sensor detection apparatus 1 according to Embodiment 1 of the invention. Incidentally, the configuration of the sensor element 100 shown in FIG. 2 is the same as that of the sensor element 100 shown in FIG. 1 as the configuration of the conventional sensor; therefore, its explanation will be omitted.

The sensor detection apparatus 1 is provided with a driving signal generating circuit 6 for driving the sensor element 100. The driving signal generating circuit 6 supplies a driving signal to the sensor element 100 and the sensor detection circuit 10 amplifies a potential difference between a potential Vs+ and a potential Vs– outputted from the sensor element 100 and outputs a result. Moreover, the sensor detection apparatus 1, by a control unit 8, judges whether any failure occurs at the sensor element 100 and the sensor detection circuit 10. The control unit 8 judges the failure through the control of the driving signal generating circuit 6, a reference potential generating circuit 7, and monitor circuits 40a, 40b, 40c, and 40d within the sensor detection circuit 10.

The driving signal generating circuit 6 generates and outputs a pulse signal which has an amplitude of about 0V to a power supply voltage Vdd and which oscillates at about 1 MHz. The generated pulse signal is outputted from a driving signal output terminal 2 of the sensor detection apparatus 1 and given to a power supply terminal 101 of the sensor element 100. The reference potential generating circuit 7 outputs a stable constant potential in which variations in power supply voltage Vdd and temperature have little effect. A reference potential, which is the output of the reference potential generating circuit 7, is supplied to the sensor detection circuit 10. Incidentally, the reference potential generating circuit 7 is configured by using a known circuit such as a reference voltage circuit using a Zener diode or a bandgap reference voltage circuit.

The two potentials Vs+ and Vs– of the sensor element 100 are inputted to the first input terminal 11 and the second terminal 12 of the sensor detection circuit 10, respectively, via the first input terminal 3 and the second input terminal 4 of the sensor detection apparatus 1, respectively. The sensor detection circuit 10 amplifies the potential difference between the inputted potentials Vs+ and Vs– and outputs a result from an output terminal 13. The output from the sensor detection circuit 10 is outputted from the sensor output terminal 5 of the sensor detection apparatus 1 as a sensor output, thereby an acceleration applied to the sensor element 100 can be judged. In addition, the result of failure detection by the control unit 8 is outputted from a failure detection output terminal 9. When failure has been detected, "H" (high-level signal) is outputted and when no failure has been detected, "L" (low-level signal) is outputted. As a result of this, for example, when an apparatus provided with a sensor according to the invention has realized that "H" is outputted from the failure detection output terminal 9, the apparatus is allowed to perform a process such as lighting of a warning lamp or voice output of a warning message.

The sensor detection circuit 10 is provided with two high-pass filters 30 which cut off low-frequency components of signals and pass their high-frequency components, an input stage differential amplifier 20 which amplifies the potential difference between the two input signals and outputs two signals having the amplified potential difference, an output stage differential amplifier 25 which amplifies the potential difference between the two input signals and outputs a result, a rectifier circuit 35 which converts a periodic signal to a direct-current signal, and so on.

Two signals inputted from the first and second input terminals 11 and 12 of the sensor detection circuit 10 are given to high-pass filters 30, respectively. Each high-pass filters 30 is provided with a capacitor C12 whose one end is connected to the input terminal and the other end is connected to the output terminal, a resistor R19 whose one end is connected between the other end of the capacitor C12 and the output terminal, and a bias power source 31 whose one end is connected to the other end of the resistor R19 and the other end is connected to a ground potential. And further, the resistor R19 and the bias power source 31 are connected in series. Accordingly, each high-pass filters 30 cuts off a signal whose frequency equal to or below a cut-off frequency, determined by the capacitance value of the capacitor C12 and the resistance value of the resistor R19, of the input signal, and outputs the result.

After low-frequency components are cut off at the high-pass filters 30, respectively, the two input signals are given to the input stage differential amplifier 20. The input stage differential amplifier 20 has two operational amplifiers 21 and 22. The two input signals are given to the non-inverting input terminals of the operational amplifier 21 and 22, respectively.

Specifically, the input stage differential amplifier 20 has a configuration described below. An output terminal of the operational amplifier 21 is connected to an inverting input terminal of the operational amplifier 21 via a resistor R11. The output terminal of the operational amplifier 22 is connected to the inverting input terminal of the operational amplifier 22 via a resistor R12. The inverting input terminal of the operational amplifier 21 and the inverting input terminal of the operational amplifier 22 are connected to each other via a series circuit comprised of a resistor R13, a capacitor C11, and a resistor R14. By such a configuration, the input stage differential amplifier 20 amplifies a potential difference between the two input signals and outputs two output signals having the amplified potential difference from the output terminals of the operational amplifiers 21 and 22.

Since each inverting input terminal of the two operational amplifiers 21 and 22 are connected to each other via the capacitor C11, the input stage differential amplifier 20 amplifies and outputs only the alternating-current components of the input signals and outputs the direct-current components of the same without amplification. This is because with regard to the direct-current components, a state in which the inverting input terminals of the two operational amplifiers 21 and 22 are not connected with each other is made due to the presence of the capacitor C11 and hence, such a state is equivalent to a case where the operational amplifiers 21 and 22 form a voltage follower circuit, respectively. As a result, offsets inherent in the operational amplifiers 21 and 22 are not amplified because they are regarded as direct-current components, so that the gain of the input stage differential amplifier 20 is increased, thereby its accuracy is increased.

The two output signals of the input stage differential amplifier 20 are given to the output stage differential amplifier 25. The output stage differential amplifier 25 amplifies a potential difference between the two input signals and outputs a result. The output stage differential amplifier 25 has an operational amplifier 26. One of the two output signals from the input stage differential amplifier 20 is given to an inverting input terminal of the operational amplifier 26 via a resistor R15 and the other is given to a non-inverting input terminal of the operational amplifier 26 via a resistor R16. Besides, an output terminal of the operational amplifier 26 is connected to the inverting input terminal of the operational amplifier 26 via a resistor R17. The non-inverting input terminal of the operational amplifier 26 is connected to the ground potential via a resistor R18 and an offset adjusting power source 27 which are connected to each other in series. The output stage differential amplifier 25 amplifies the potential difference between the two signals at an amplification factor determined by these resistors R15, R16, R17, and R18. In addition, a resistor R20 is connected in series to the output terminal of the operational amplifier 26. An output signal of the operational amplifier 26 is outputted via the resistor R20 as an output signal from the output stage differential amplifier 25.

The output signal of the output stage differential amplifier 25 is given to a rectifier circuit 35. The rectifier circuit 35 has a known circuit configuration configured by combining, for example, a bridge circuit comprised of plural diodes and a low-pass filter comprised of a resistor and a capacitor. The output signal of the output stage differential amplifier 25, which has been converted to a direct-current signal by the rectifier circuit 35, is outputted from the sensor output terminal 5 of the sensor detection apparatus 1 as a sensor output by being outputted from the output terminal 13 of the sensor detection circuit 10.

The sensor detection circuit 10 is provided with a monitor circuit 40a which monitors the potential of the input signal on the side of the operational amplifier 21 of the two input signals to the input stage differential amplifier 20, and a monitor circuit 40b which monitors the potential of the input signal on the side of the operational amplifier 22 of the same. Further, the sensor detection circuit 10 is provided with a monitor circuit 40c which monitors the potential of the output signal on the side of the operational amplifier 21 of the two output signals from the input stage differential amplifier 20, and a monitor circuit 40d which monitors potential of the output signal on the side of the operational amplifiers 22 of the same. Incidentally, in FIG. 3, the connection to the reference potential generating circuit 7 and to the control unit 8 are not shown. However, the reference potential generating circuit 7 and the control unit 8 are connected to the monitor circuits 40a, 40b, 40c, and 40d respectively.

Figure 4:
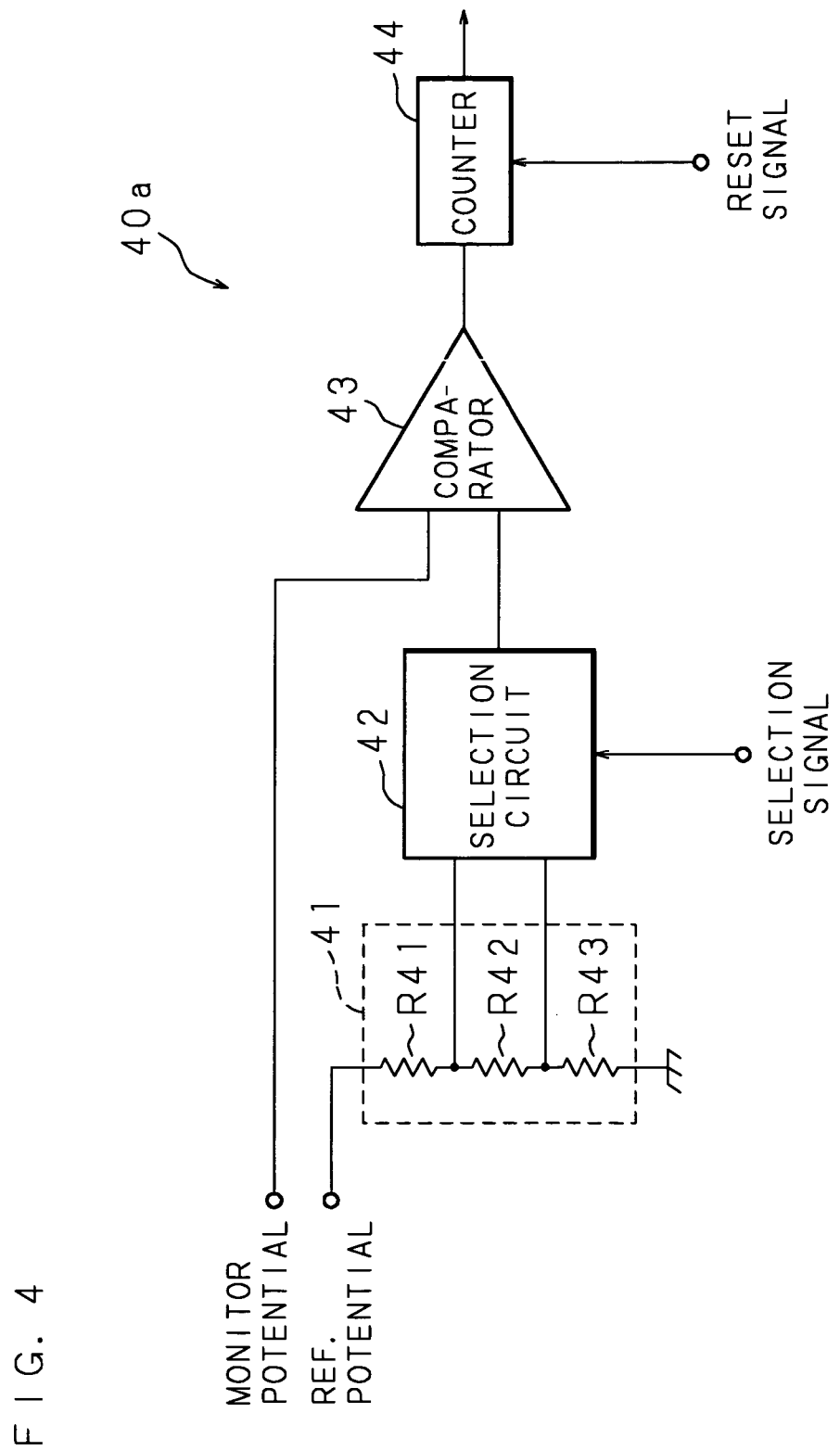
FIG. 4 is a circuit diagram showing a configuration of monitor circuits of the sensor detection circuit according to the invention.

FIG. 4 is a circuit diagram showing a configuration of the monitor circuit 40a of the sensor detection circuit according to the invention. To the monitor circuit 40a, a monitor potential which is the potential of each monitoring point, a reference potential outputted from the reference potential generating circuit 7, and a selection signal and a reset signal as control signals from the control unit 8 are given. In addition, the monitor circuit 40a has a voltage dividing circuit 41 which divides a voltage between the reference potential and the ground potential, a selection circuit 42 which selects and outputs one potential from plural input potentials, a comparator 43 which compares the magnitudes of two inputted potentials, and a counter 44 which counts the number of times of changing of an input signal.

The voltage dividing circuit 41 is a circuit in which three resistors R41, R42, and R43 are connected in series between an input terminal, to which the reference potential is inputted, and the ground potential in that order from the side of the reference potential. The potential between the resistors R41 and R42 and the potential between the resistors R42 and R43 are outputted as comparison reference potentials, respectively. The two comparison reference potentials, which are outputs from the voltage dividing circuit 41, are inputted to the selection circuit 42.

The selection circuit 42 outputs any one of the two comparison reference potentials and gives to the comparator 43 according to a selection signal given from the control unit 8. The selection signal from the control unit 8 is, for example, a logical signal of one bit. The selection circuit 42 is configured so as to output the higher of the two comparison reference potentials when the selection signal is "H", but to output the lower comparison reference potential when the selection signal is "L".

FIG. 5 is a circuit diagram showing an example of a configuration of the selection circuit 42 according to the invention. The selection circuit 42 is provided with a transmission gate circuit configured by connecting sources of a PMOS transistor P1 and a NMOS transistor N1 to each other and by connecting drains of the same to each other, and a transmission gate circuit similarly configured by connecting sources of a PMOS transistor P2 and a NMOS transistor N2 to each other and by connecting drains of the same to each other. The two comparison reference potentials are inputted to the input sides of the two transmission gate circuits respectively, and then outputs of the two transmission gate circuits are subjected to wired OR to be outputted as an output potential.

Specifically, a terminal to which one of the comparison reference potentials (comparison reference potential 1) is inputted is connected to the sources of the PMOS transistor P1 and the NMOS transistor N1, a terminal to which the other (comparison reference potential 2) is inputted is connected to the sources of the PMOS transistor P2 and the NMOS transistor N2, and the drains of all the transistors are connected to a terminal which outputs an output potential. A terminal to which the selection signal is inputted is connected to the gates of the NMOS transistor N1 and the PMOS transistor P2. Moreover, the selection circuit 42 is provided with an inverter 47 which inverts the logic of a signal and to an input of the inverter 47, the terminal to which the selection signal is inputted is connected. An output of the inverter 47 is connected to the inputs of the PMOS transistor P1 and the NMOS transistor N2.

In the selection circuit 42 having such a configuration, when the selection signal is "H", the transmission gate circuit comprised of the PMOS transistor P1 and the NMOS transistor N1 conducts and the transmission gate circuit comprised of the PMOS transistor P2 and the NMOS transistor N2 does not conducts, thereby the comparison reference potential 1 is outputted as the output potential. When the selection signal is "L", the comparison reference potential 2 is outputted.

The comparator 43 compares a monitor potential and the comparison reference potential selected by the selection circuit 42, and, for example, when the monitor potential is higher than the comparison reference potential, outputs "H", and when the monitor potential is lower than the comparison reference potential, outputs "L". The comparator 43 is configured by a known circuit using an operational amplifier and the output of the comparator 43 is given to the counter 44.

The counter 44 is configured by plural flip-flops and counts up count values according to the rising edge of the output signal form the comparator 43. The count value is reset by a reset signal from the control unit 8. The count value of the counter 44 is given to the control unit 8 as the output of the monitor circuit 40a.

Although not shown, the circuit configurations of the other monitor circuits 40b, 40c, and 40d are the same as that of the monitor circuit 40a shown in FIG. 4. Incidentally, the monitor circuits 40a and 40b are equal in resistance values of the resistors R41, R42, and R43, but the monitor circuits 40c and 40d differs from the monitor circuit 40a in resistance values of the resistors R41, R42, and R43. Therefore the monitor circuits 40a and 40b differs from the monitor circuits 40c and 40d in comparison reference potential used at the comparators 43.

The control unit 8 judges whether a pulse signal generated by the driving signal generating circuit 6 is correctly transmitted from the sensor element 100 to the individual monitoring points, at which the monitor circuits 40a, 40b, 40c, and 40d are provided, based on the count values of the outputs of the monitor circuits 40a, 40b, 40c, and 40d. At this time, the control unit 8 compares an expected value, which is represented by the number of the pulses of a pulse signal outputted from the driving signal generating circuit 6 within a predetermined time period, with the count values of the outputs of the monitor circuits 40a, 40b, 40c, and 40d. For example, when the driving signal generating circuit 6 outputs a pulse signal having a cycle of 1 μs, the control unit 8 resets the counters 44 of the monitor circuits 40a, 40b, 40c, and 40d and after 100 μs, the control unit 8 obtains the output values of the counters 44. At that time, the expected values of the counters 44 are 100 and hence, the control unit 8 is able to judge whether failure occurs by judging whether the obtained count values are 100.

Moreover, the control unit 8 compares the count values and the expected value several times by using plural comparison reference potentials by switching between the selection circuits 42 of the monitor circuits 40a, 40b, 40c, and 40d. When it has been judged from the comparison results of the count values and the expected values that failure occurs at the sensor element 100 or the sensor detection circuit 10, the control unit 8 outputs "H" to the failure detection output terminal 9 of the sensor detection apparatus 1. When it has been judged that no failure occurs, the control unit 8 outputs "L" to the failure detection output terminal 9.

For example, when disconnection has occurred at the Wheatstone bridge circuit of the sensor element 100, a pulse signal from the driving signal generating circuit 6 is not transmitted to the monitoring points at all, so that the count values of the monitor circuits 40a, 40b, 40c, and 40d are not increased; thereby the control unit 8 is able to detect the failure.

Figure 6:
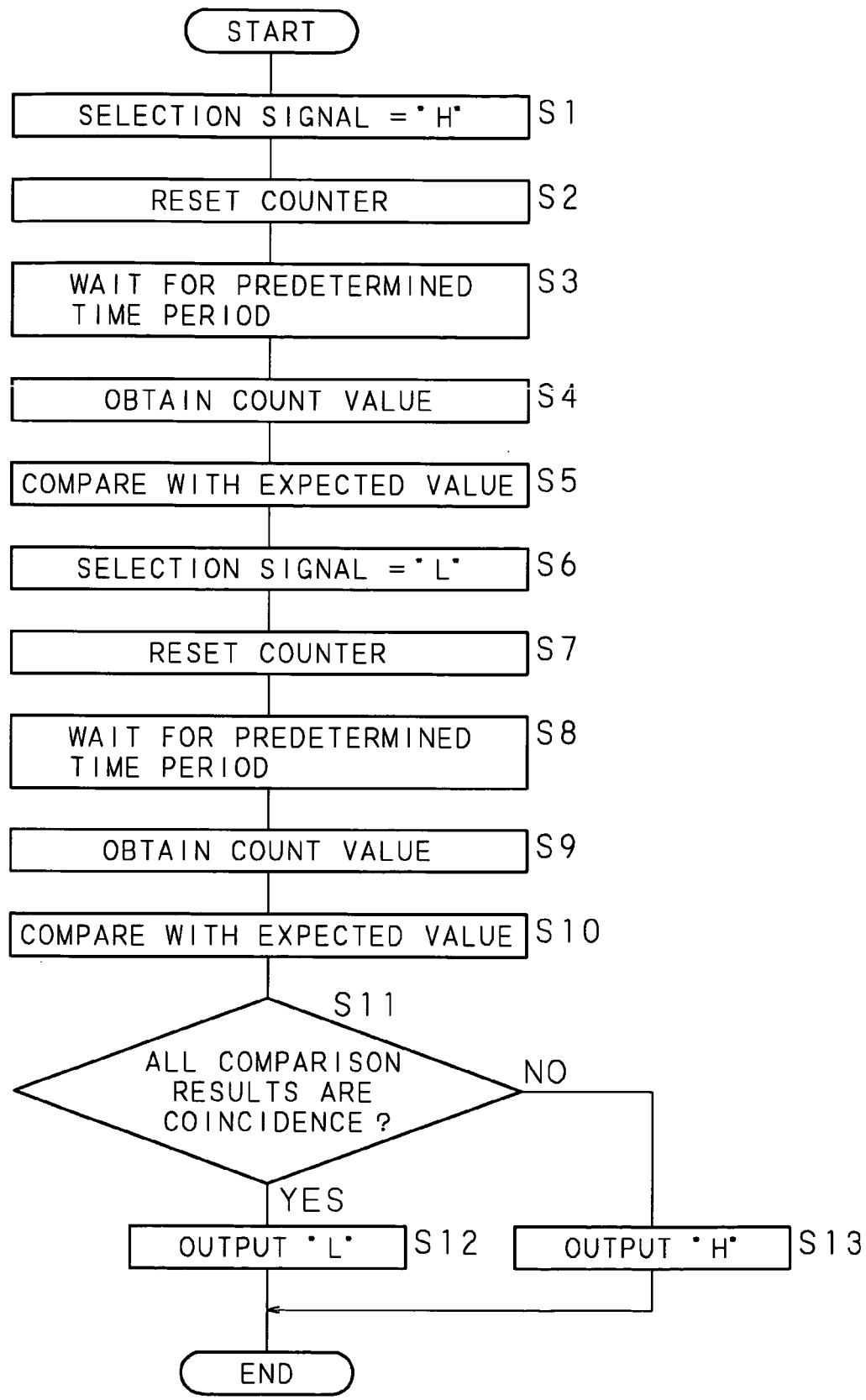
FIG. 6 is a flowchart showing a procedure of a failure detection process conducted by a control unit of a sensor detection apparatus according to the invention.

FIG. 6 is a flowchart showing a procedure of a failure detection process performed by the control unit 8 of the sensor detection apparatus 1 according to the invention. At first, the control unit 8 outputs "H" as a selection signal (Step S1) to make a preparation for the comparisons with the higher comparison reference potential. Then the control unit 8 resets the counters 44 (Step S2). Thereafter, the control unit 8 waits for a predetermined time period, e.g., a time period corresponding to 100 cycles of a pulse signal generated by the driving signal generating circuit 6 (Step S3). After the passage of the predetermined time period, the control unit 8 obtains the count values which are the outputs of the counters 44 (Step S4) and makes the comparisons with the expected values (Step S5).

After the completing of the comparison with the expected values, the control unit 8 outputs "L" as the selection signal (Step S6) to make a preparation for the comparisons with the lower comparison reference potentials. Then the control unit 8 resets the counters 44 (Step S7,). Thereafter, the control unit 8 waits for a predetermined time period (Step S8). After the passage of the predetermined time period, the control unit 8 obtains the count values which are the outputs of the counters 44 (Step S9) and makes the comparisons with the expected values (Step S10).

Then the control unit 8 checks whether all the comparison results of the count values of the counters 44 and the expected values obtained at Steps S5 and S10 coincide with one another (Step S11). When all the comparison results coincide with one another (Step S11:YES), no failure occurs, so the control unit 8 outputs "L" from the failure detection output terminal 9 (Step S12). When even one of the comparison results does not coincide with the others (Step S11:NO), failure occurs, so the control unit 8 outputs "H" from the failure detection output terminal 9 (Step S13). After outputting the "H" or "L" from the failure detection output terminal 9, the control unit 8 ends the process.

FIG. 7A to FIG. 7G are schematic waveform charts showing examples of operations of the sensor detection circuit according to the invention. Specifically, shown in the charts are the states of individual signals when acceleration is not applied to the sensor element 100 in a state in which no failure occurs at the sensor element 100 and the sensor detection circuit 10. The individual waveforms shown in FIG. 7A to FIG. 7G are as follows:

FIG. 7A: a driving signal from the driving signal generating circuit 6;

FIG. 7B: an input signal Va to the operational amplifier 21 which is one input to the input stage differential amplifier 20;

FIG. 7C: an input signal Vb to the operational amplifier 22 which is the other input to the input stage differential amplifier 20;

FIG. 7D: an output signal Vc from the operational amplifier 21;

FIG. 7E: an output signal Vd from the operational amplifier 22;

FIG. 7F: an output signal Vz from the output stage differential amplifier 25; and FIG. 7G: a sensor output signal from the sensor detection apparatus 1.

And further, the high-level and the low-level of the comparison reference potentials of the monitor circuits 40a and 40b are indicated by alternate long and short dash lines in the charts as V1 and V2, respectively. Still further, the high-level and the low-level of the comparison reference potentials of the monitor circuits 40c and 40d are indicated by alternate long and short dash lines in the charts as V3 and V4, respectively.

Incidentally, in examples of subsequent operations of the sensor detection circuit 10, it is assumed that the resistors R11 and R12 within the input stage differential amplifier 20 have the same resistance value and the resistors R13 and R14 do too. Moreover, it is assumed that the resistors R15 and R16 of the output stage differential amplifier 25 have the same resistance value and the resistors R17 and R18 do too.

As the driving signal from the driving signal generating circuit 6 to the sensor element 100, a pulse signal with constant cycles is inputted (see FIG. 7A). In a state in which acceleration is not applied to the sensor element 100, signals generated by halving the amplitude of the driving signal are each outputted to the sensor detection circuit 10 as the outputs Vs+ and Vs− of the sensor element 100. The two signals inputted to the sensor detection circuit 10 each pass through the high-pass filters 30 to be given to the input stage differential amplifier 20 as two input signals Va and Vb (see FIG. 7B and FIG. 7C).

Relationships between the potentials of the input and output signals of the input stage differential amplifier 20 are represented by following expressions respectively; however, in the following, it is assumed that the reference characters representing the signals also represent the potential of each signal.

$$Vc - Vd = \alpha 0 \times (Va - Vb) \quad (1),$$

$$Vc = \alpha 1 \times Va - \alpha 2 \times Vb \quad (2), \text{ and}$$

$$Vd = \alpha 1 \times Vb - \alpha 2 \times Va \quad (3)$$

where $\alpha 1 > \alpha 2$, and $\alpha 0$, $\alpha 1$, and $\alpha 2$ are amplification factors determined by the resistance values of the resistors R11, R12, R13, and R14 and the capacitance value of the capacitor C11.

When acceleration is not applied to the sensor element 100, the input signals Va and Vb given to the input stage differential amplifier 20 are equal in potential, so the output signals Vc and Vd are also equal in potential (see FIG. 7D and FIG. 7E). The output signals Vc and Vd of the input stage differential amplifier 20 are given to the output stage differential amplifier 25.

A relationship between the potentials of the input and output signals of the output stage differential amplifier 25 is represented by the following expression:

$$Vz = \beta \times (Vd - Vc) \quad (4)$$

where $\beta$ is an amplification factor determined by the resistance values of the resistors R15, R16, R17, and R18.

Therefore, when the output signals Vc and Vd are equal in potential, the potential of the output Vz of the output stage differential amplifier 25 becomes zero (see FIG. 7F) and the sensor output of the sensor detection apparatus 1 also becomes 0V (see FIG. 7G).

FIG. 8A to FIG. 8G are schematic waveform charts showing examples of operations when acceleration is applied to the sensor element 100. Specifically, shown in FIG. 8A to FIG. 8G are the states of the individual signals when the resistance values of piezoresistors R1 and R4 are increased and the resistance values of piezoresistors R2 and R3 are decreased by applying acceleration on the sensor element 100 in a state in which no failure occurs at the sensor element 100 and the sensor detection circuit 10. Incidentally, in FIG. 8A to FIG. 8G, the waveforms of the same signals as those shown in FIG. 7A to FIG. 7G are shown, respectively.

In this case, the amplitude of the input signal Va to the input stage differential amplifier 20 is decreased and the amplitude of the input signal Vb is increased as compared with those shown in FIG. 7B and FIG. 7C (see FIG. 8B and FIG. 8C). According to the above mentioned expressions (1) to (3), the output signals Vc and Vd are outputted from the input stage differential amplifier 20 so as to amplify the potential difference between the input signals Va and Vb (see FIG. 8D and FIG. 8E). According to the expression (4), the output stage differential amplifier 25 further amplifies the potential difference between the output signals Vc and Vd of the input stage differential amplifier 20 to output as the output signal Vz (see FIG. 8F). The output signal Vz is converted to a direct-current signal at the rectifier circuit 35 and outputted as the sensor output (see FIG. 8G). At this time, as shown in FIG. 8G, since the potential of the sensor output is larger than 0V, judgment that acceleration is applied to the sensor element 100 can be made.

Moreover, as shown in FIG. 7A to FIG. 7G and FIG. 8A to FIG. 8G, in the ranges of fluctuation of the amplitudes of the input signals Va and Vb when no failure occurs at the sensor element 100 and the sensor detection circuit 10, the comparison reference potentials V1 and V2 of the monitor circuits 40a and 40b are set in advance in such a way that the values of the counters 44 are not counted up when comparisons with the higher comparison reference potential V1 have been made, and that the values of the counters 44 are counted up when comparisons with the lower comparison reference potential V2 have been made. Likewise, the comparison reference potentials V3 and V4 of the monitor circuits 40c and 40d are set in advance in such a way that the values of the counters 44 are not counted up when the comparisons with the higher comparison reference potentials V3 have been made, and the values of the counters 44 are counted up when the comparisons with the lower comparison reference potentials V4 have been made. Therefore the control unit 8 judges the state in which the values of the counters 44 are not counted up in a case where the monitor circuits 40a, 40b, 40c, and 40d have made the comparisons with the higher comparison reference potentials, and the values of the counters 44 are counted up in a case where they have made the comparisons with the lower comparison reference potentials, as a normal state in which no failure occurs, and then outputs "L" to the failure detection output terminal 9.

FIG. 9A to FIG. 9G are schematic waveform charts showing examples of operations when the piezoresistor R4 of the sensor element 100 fails due to disconnection; however, it is assumed that no acceleration is applied to the sensor element 100. Incidentally, in FIG. 9A to FIG. 9G, the waveforms of the same signals as those shown in FIG. 7A to FIG. 7G are shown, respectively.

In this case, as one input signal Va of the input stage differential amplifier 20, signals generated by halving the amplitude of the driving signal are given as in the case of the normal state in which no failure occurs shown in FIG. 7B (see FIG. 9B), and as the other input signal Vb, the driving signal is given intact without halving the amplitude of the driving signal because the disconnection occurs at piezoresistor R4 (see FIG. 9C). According to the expressions (1) to (3), the output signals Vc and Vd are outputted from the input stage differential amplifier 20 so as to amplify the potential difference between the input signals Va and Vb. At this time, since the amplitude of the input signal Vb is larger than that of the input signal Va, the input stage differential amplifier 20 amplifies in such a way that the amplitude of the output signal Vc becomes smaller (see FIG. 9D) and that the amplitude of the output signal Vd becomes larger (see FIG. 9E).

When the monitor circuit 40a for monitoring the input signal Va has made the comparison by using the higher comparison reference potential V1, the value of the counter 44 is not counted up and when the comparison have been made by using the lower comparison reference potential V2, the value of the counter 44 is counted up, so the control unit 8 judges that a normal state in which no failure occurs is brought about. However, when the monitor circuit 40b for monitoring the input signal Vb has made the comparison by using the higher comparison reference potential V1, the value of the counter 44 is counted up, so the control unit 8 judges that the failure occurs. Moreover, when the monitor circuit 40c for monitoring the output signal Vc has made the comparison by using the lower comparison reference potential V4, the value of the counter 44 is not counted up, and when the monitor circuit 40d for monitoring the output signal Vd has made the comparison by using the higher comparison reference potential V3, the value of the counter 44 is counted up, so the control unit 8 also judges from the outputs of both the monitor circuits 40c and 40d that the failure occurs.

Therefore, since it is judged from the three outputs of the monitor circuits 40b, 40c, and 40d that failure occurs, the control unit 8 judges that the failure occurs at the sensor element 100 and then outputs "H" to the failure detection output terminal 9.

FIG. 10A to FIG. 10G are schematic waveform charts showing examples of operations when the piezoresistors R2 and R4 of the sensor element 100 fail due to disconnection; however, it is assumed that no acceleration is applied to the sensor element 100. Incidentally, in FIG. 10A to FIG. 10G, the waveforms of the same signals as those shown in FIG. 7A to FIG. 7G are shown, respectively.

In this case, as the input signals Va and Vb of the input stage differential amplifier 20, the driving signals are given intact (see FIG. 10B and FIG. 10C). Since the signals, which are equal in amplitude and large in amplitude, are given as the input signals Va and Vb, the input stage differential amplifier 20 outputs the output signals Vc and Vd which are equal in amplitude and larger in amplitude (see FIG. 10D and FIG. 11E).

The monitor circuits 40a and 40b for monitoring the input signals Va and Vb, respectively have made the comparisons by using the higher comparison reference potential V1, the values of the counters 44 are counted up, so the control unit 8 judges that the failures occur. Moreover, when the monitor circuits 40c and 40d for monitoring the output signals Vc and Vd, respectively have made the comparisons by using the higher comparison reference potential V3, the values of the counters 44 are counted up, so the control unit 8 judges that the failures occur. Therefore, since the judgment that the failures occur is made from the four outputs of the monitor circuits 40a, 40b, 40c, and 40d, the control unit 8 judges that the failures occur at the sensor element 100 and then outputs "H" to the failure detection output terminal 9.

The examples of the operations when the piezoresistor R4 of the sensor element 100 fails due to disconnection have been shown in FIG. 9A to FIG. 9G, and the examples of the operations when the piezoresistors R2 and R4 fail due to disconnection have been shown in FIG. 10A to FIG. 10G; however, with the sensor element 100, there are also other failure patterns. Although not shown, when, for example, the piezoresistor R1 has failed due to disconnection, the driving signal from the driving signal generating circuit 6 is not transmitted to the first output terminal 102 of the sensor element 100, so that the output Vs+ of the sensor element 100 comes to have the ground potential. In this case, since the value of the counter 44 of the monitor circuit 40a for monitoring one input signal Va of the input stage differential amplifier 20 is not counted up, the control unit 8 is able to detect the failure. Likewise, when the piezoresistors R1 and R3 have failed due to disconnection, the values of the counters 44 of the monitor circuits 40a and 40b for monitoring the input signals Va and Vb of the input stage differential amplifier 20, respectively are not counted up, so that the control unit 8 is able to detect the failures. Combinations of other disconnection failures and detection results of failures by the monitor circuits 40a, 40b, 40c, and 40d will be shown in Table 1 below. Incidentally, in Table 1, "O" denotes failure detection at the corresponding monitor circuit(s) and "X" denotes nondetection.

TABLE 1

| DISCONNECTED | MONITOR CIRCUIT | | | |
|---|---|---|---|---|
| PIEZORESISTOR | 40a | 40b | 40c | 40d |
| R1 | O | X | O | O |
| R2 | O | X | O | O |
| R3 | X | O | O | O |
| R4 | X | O | O | O |
| R1 and R2 | O | X | O | O |
| R1 and R3 | O | O | O | O |
| R1 and R4 | O | O | O | O |
| R2 and R3 | O | O | O | O |
| R2 and R4 | O | O | O | O |
| R3 and R4 | X | O | O | O |
| R2, R3 and R4 | O | O | O | O |
| R1, R3 and R4 | O | O | O | O |
| R1, R2 and R4 | O | O | O | O |
| R1, R2 and R3 | O | O | O | O |
| R1, R2, R3 and R4 | O | O | O | O |

Next, examples of operations when failure occurs at the sensor detection circuit 10 will be described. FIG. 11A to FIG. 11G are schematic waveform charts showing examples of operations when a failure that the resistor R11 within the input stage differential amplifier 20 short-circuits to the ground potential occurs; however, it is assumed that no acceleration is applied to the sensor element 100. Incidentally, in FIG. 11A to FIG. 11G, the waveforms of the same signals as those shown in FIG. 7A to FIG. 7G are shown, respectively.

In this case, as the input signals Va and Vb of the input stage differential amplifier 20, signals generated by halving the amplitudes of the driving signals are given as in the case of the normal state in which the failure does not occur shown in FIG. 7B and FIG. 7C (see FIG. 11B and FIG. 11C). However, since the resistor R11 within the input stage differential amplifier 20 is short-circuited to the ground potential due to failure, the output signal Vc comes to have the ground potential (see FIG. 11D), while the output signal Vd becomes a signal generated by increasing the amplitude of the input signal Vb regardless of the input signal Va (see FIG. 11E).

From the outputs of the monitor circuits 40a and 40b for monitoring the input signals Va and Vb, respectively, the control unit 8 judges that no failure occurs. When the monitor circuit 40c for monitoring the output signal Vc has made the comparison by using the lower comparison reference potential V4, the value of the counter 44 is not counted up, so that the control unit 8 judges that the failure occurs. Moreover, the monitor circuit 40d for monitoring the output signal Vd has made the comparison by using the higher comparison reference potential V3, the value of the counter 44 is counted up, so that the control unit 8 judges that the failure occurs. Therefore, since the judgment that the failure occurs is made from only the outputs of the monitor circuits 40c and 40d, the control unit 8 determines that the failure occurs at the input stage differential amplifier 20 and then outputs "H" to the failure detection output terminal 9.

FIG. 12A to FIG. 12G are schematic waveform charts showing examples of operations when the resistor R13 within the input stage differential amplifier 20 fails due to disconnection; however, it is assumed that no acceleration is applied to the sensor element 100. Incidentally, in FIG. 12A to FIG. 12G, the waveforms of the same signals as those shown in FIG. 7A to FIG. 7G are shown, respectively.

In this case, as the input signal Va an Vb of the input stage differential amplifier 20, signals generated by halving the amplitudes of the driving signals are given as in the case of the normal state in which no failure occurs shown in FIG. 7B and FIG. 7C (see FIG. 12B and FIG. 12C). However, when the resistor R13 within the input stage differential amplifier 20 fails due to disconnection, the operational amplifier 21 and the resistor R11, and the operational amplifier 22 and the resistor R12 form non-inverting amplifiers both having amplification factors of 1, i.e., a so-called voltage follower circuits, respectively. Therefore, in this case, the input signals Va and Vb are outputted intact without being amplified as the output signals Vc and Vd (see FIG. 12D and FIG. 12E).

From the outputs of the monitor circuits 40a and 40b for monitoring the input signals Va and Vb, respectively, the control unit 8 judges that no failure occurs. However, since the input signals Va and Vb are not amplified at the input stage differential amplifier 20, the values of the counters 44 are not counted up when the monitor circuits 40c and 40d for monitoring the output signals Vc and Vd, respectively have made the comparison by using the lower comparison reference potentials V4, so that the control unit 8 judges that failure occurs. Therefore, since the judgment that the failure occurs is made from only the outputs of the monitor circuits 40c and 40d, the control unit 8 judges that the failure occurs at the input stage differential amplifier 20 and then outputs "H" to the failure detection output terminal 9.

Incidentally, in the examples of the operations when the failures occur at the sensor element 100 or the sensor detection circuit 10 which have been shown in FIG. 9A to FIG. 9G, FIG. 10A to FIG. 10G, FIG. 11A to FIG. 11G, and FIG. 12A to FIG. 12G, the cases where no acceleration is applied to the sensor element 100 have been explained on the charts. However, when acceleration is applied to the sensor element 100, a potential difference generated between the potentials Vs+ and Vs− of the sensor element 100 is on the order of several millivolts, but when the failure has occurred at the sensor element 100 and the sensor detection circuit 10, differences on the order of several hundreds of millivolts to several volts generate in comparisons of the potentials of the monitoring points in the monitor circuits 40a, 40b, 40c, and 40d to their potentials during normal operation. Therefore, by suitably setting the comparison reference potentials Va, Vb, Vc, and Vd, failure can be detected even in the state where acceleration is applied to the sensor element 100.

In the acceleration sensor having such a configuration, acceleration can be detected by the sensor element 100 using the pulse signal outputted from the driving signal generating circuit 6 and the failures of the sensor element 100 and the input stage differential amplifier 20 can be detected. By increasing the frequency of the pulse signal outputted from the driving signal generating circuit 6, 1/f noises in the operational amplifiers in the input stage differential amplifier 20 and the output stage differential amplifier 25 can be reduced, thereby acceleration can be detected with higher accuracy. And further, by providing the monitor circuits 40a and 40b and the monitor circuits 40c and 40d for monitoring the two input signals and the two output signals of the input stage differential amplifier 20, respectively, a judgment whether failure occurs at not only the sensor element 100 but the input stage differential amplifier 20 can be made. In addition, when an abnormal sensor output is generated despite the judgment that no failure occurs at the monitor circuits 40a, 40b, 40c, and 40d, the judgment that failure occurs at the output stage differential amplifier 25 or the rectifier circuit 35 can be indirectly made.

In Embodiment 1, the configuration in which the monitor circuits 40a, 40b, 40c, and 40d are each provided to their corresponding monitoring points of the sensor detection circuit 10 has been shown; however, the invention is not limited thereto. For example, a configuration may be used in which a single monitor circuit is provided to the sensor detection circuit 10 and the potentials of the monitoring points are inputted to the single monitor circuit one by one by switching the potentials. Also, in Embodiment 1, the configuration in which the potentials of the four monitoring points of the sensor detection circuit 10 are monitored by the four monitor circuits 40a, 40b, 40c, and 40d has been shown; however, the invention is not limited thereto. For example, a configuration may be used in which the potentials of at least five or at most three monitoring points are monitored. Besides, in Embodiment 1, the configuration in which the individual monitor circuits 40a, 40b, 40c, and 40d each make the comparisons by using the two comparison reference potentials has been shown; however, the invention is not limited thereto. For example, a configuration may be used in which the comparisons are made by using one or at least three comparison reference potentials. And further, in Embodiment 1, the configuration in which the monitor circuits 40a, 40b, 40c, and 40d each have the selection circuit 42 to switch between the plural comparison reference potentials has been shown; however, the invention is not limited thereto. For example, a configuration may be used in which the monitor circuits 40*a*, 40*b*, 40*c*, and 40*d* each have the comparator 43 and the counter 44 plurally to make comparisons with the plural comparison reference potentials. Still further, in Embodiment 1, the configuration in which the monitor circuits 40*a* and 40*b* is provided to the output sides of the high-pass filters 30's has been shown; however, a configuration may be used in which they are provided to the input sides of the high-pass filters 30. Furthermore, in Embodiment 1, a configuration may be used in which the sensor detection circuit 10 does not have the high-pass filters 30 in a case where there is no need to have them. Moreover, in Embodiment 1, the configuration in which the driving signal generated by the driving signal generating circuit 6 is the pulse signal has been shown; however, the invention is not limited thereto. For example, other signals such as a sine wave signal and a triangular wave signal may be used. In addition, the examples of the operations shown in FIG. 7A to FIG. 7G, FIG. 8A to FIG. 8G, FIG. 9A to FIG. 9G, FIG. 10A to FIG. 10G, FIG. 11A to FIG. 11G, and FIG. 12A to FIG. 12G are merely exemplifications and the invention is not limited thereto; therefore other failures can be detected by using similar methods.

Embodiment 2

FIG. 13 is a circuit diagram showing a configuration of an acceleration sensor according to Embodiment 2 of the invention. The sensor detection apparatus 1*a* of the acceleration sensor according to Embodiment 2 differs in configuration from the sensor detection apparatus 1 of that according to Embodiment 1.

The sensor detection apparatus 1*a* is provided with a constant-current source 71 and the driving signal generating circuit 6, both of which are used to drive the sensor element 100. The apparatus 1*a* is also provided with a selector which selects either an output of the constant-current source 71 or an output of the driving signal generating circuit 6 to give the output from the driving signal output terminal 2. The selector 70 is controlled by the control unit 8 in such a way that the output of the constant-current source 71 is given to the sensor element 100 during normal operation in which acceleration detection is performed and that the output of the driving signal generating circuit 6 is given to the sensor element 100 during failure detection operation in which the detection of failure is performed at the sensor element 100 and the sensor detection apparatus 1*a*.

Moreover, the sensor detection apparatus 1*a* is provided with the reference potential generating circuit 7, which generates a reference potential, and a sensor detection circuit 10*a* which amplifies a potential difference between the two potentials Vs+ and Vs− of the sensor element 100 and outputs results. The output of the reference potential generating circuit 7 is given to the sensor detection circuit 10*a*. During the failure detection operation, the sensor detection circuit 10*a* is able to perform the detection of the failure at the sensor element 100 and the sensor detection circuit 10*a* by controlling of the control unit 8.

The two potentials Vs+ and Vs− of the sensor element 100 are inputted to the first and second input terminals 11 and 12 of the sensor detection circuit 10*a* via the first and second input terminals 3 and 4 of the sensor detection apparatus 1*a*, respectively. The sensor detection circuit 10*a* amplifies a potential difference between the inputted potentials Vs+ and Vs− and outputs results from a first output terminal 13*a* and a second output terminal 13*b*, respectively. As sensor outputs, the two outputs are given from the first and second sensor output terminals 5*a* and 5*b* of the sensor detection apparatus 1*a*, respectively. Both the output signals outputted from the first and second output terminals 13*a* and 13*b* are the signals generated by amplifying the potential difference between the potentials Vs+ and Vs− of the sensor element 100 but have mutually different amplification factors. In addition, a result of the failure detection performed by the control unit 8 is outputted from the failure detection output terminal 9.

FIG. 14 is a circuit diagram showing a configuration of the sensor detection circuit 10*a* according to Embodiment 2 of the invention. Incidentally, in FIG. 14, a connection between the reference potential generating circuit 7 and the control unit 8 is not shown, but they are each connected with the monitor circuits 40*a*, 40*b*, 40*c*, and 40*d*.

The two signals inputted from the firs and second input terminals 11 and 12 of the sensor detection circuit 10*a* are given to an input stage differential amplifier 50. The input stage differential amplifier 50 has two operational amplifiers 51 and 52, and the two input signals are given to the non-inverting input terminals of the operational amplifiers 51 and 52 respectively. An output terminal of the operational amplifier 51 is connected to an inverting input terminal of the operational amplifier 51 via a resistor R51. An output terminal of the operational amplifier 52 is connected to an inverting input terminal of the operational amplifier 52 via a resistor R52. In addition, both inverting input terminals of the operational amplifiers 51 and 52 are connected with each other via a resistor R53. The input stage differential amplifiers 50 amplifies a potential difference between the two input signals and outputs two output signals having the amplified potential difference from the output terminals of the operational amplifiers 51 and 52, respectively.

The two output signals of the input stage differential amplifier 50 are given to an output stage differential amplifier 25. The output stage differential amplifier 25 amplifies a potential difference of the two signals inputted and output results. Incidentally, the input stage differential amplifier 50 and the output stage differential amplifier 25 can be considered to be one differential amplifier altogether. In this case, a so-called instrumentation amplifier is configured by the two differential amplifiers. Having a high common phase rejection ratio, the instrumentation amplifier has the advantages that it is resistant to noise and has a high input impedance.

The output signal of the output stage differential amplifier 25 is not only outputted from the first output terminal 13*a* but given to a non-inverting amplifier 60. The non-inverting amplifier 60 has an operational amplifier 61 and two resistors R54 and R55. The output signal from the output stage differential amplifier 25 is given to a non-inverting input terminal of the operational amplifier 61. An output terminal of the operational amplifier 61 is connected to an inverting input terminal of the operational amplifier 61 via the resistor R55. An inverting input terminal of the operational amplifier 61 is connected to a power source potential via the resistor R54.

An output of the non-inverting amplifier 60 is given to an inverting amplifier 65. The inverting amplifier 65 has an operational amplifier 66, two resistors R56 and R57, and an offset adjusting power source 67. The output terminal of the non-inverting amplifier 60 is connected to an inverting input terminal of the operational amplifier 66 via the resistor R56. Moreover, an output terminal of the operational amplifier 66 is connected to the inverting input terminal of the operational amplifier 66 via the resistor R57, and the offset adjusting power source 67 is connected to an non-inverting input terminal of the operational amplifier 66.

The output of the inverting amplifier 65 is given to the second output terminal of the sensor detection circuit 10a. That is, the sensor detection circuit 10a outputs the output of the output stage differential amplifier 25 intact from the first output terminal 13a but also outputs from the second output terminal 13b by further amplifying by the non-inverting amplifier 60 and the inverting amplifier 65.

Further, the sensor detection circuit 10a is provide with the monitor circuit 40a for monitoring the potential of the input signal on the side of the operational amplifier 51 of the two input signals to the input stage differential amplifier 50, and the monitor circuit 40b for monitoring the potential of the input signal on the side of the operational amplifier 52 of the same. Furthermore, the sensor detection circuit 10a is provide with the monitor circuit 40c for monitoring the potential of the output signal on the side of the operational amplifier 51 of the two output signals from the input stage differential amplifier 50, and the monitor circuit 40d for monitoring the potential of the output signal on the side of the operational amplifier 52 of the same. When performing the failure detection at the sensor element 100 and the sensor detection circuit 10a, by giving a pulse signal outputted from the driving signal generating circuit 6 to the sensor element 100 by switching the selector 70, the control unit 8 of the sensor detection apparatus 1a is able to judge whether the pulse signal is correctly transmitted to the inputs and outputs of the input stage differential amplifier 50 based on the judgment whether count values of the counters 44 of the monitor circuits 40a, 40b, 40c, and 40d are counted up.

Incidentally, the operations of the monitor circuits 40a, 40b, 40c, and 40d during the failure detection at the sensor element 100 and the sensor detection circuit 10a are the same as those shown in FIG. 9A to FIG. 9G, FIG. 10A to FIG. 10G, FIG. 11A to FIG. 11G, and FIG. 12A to FIG. 12G given in Embodiment 1 and therefore, their explanation will be omitted.

In the acceleration sensor having such a configuration according to Embodiment 2, the failure detection at the sensor element 100 and the sensor detection circuit 10a can be performed by giving the pulse signal to the sensor element 100 by switching the selector 70 and by monitoring the inputs and the outputs of the input stage differential amplifier 50 at the monitor circuits 40a, 40b, 40c, and 40d. In addition, a circuit resulting from the removal of the monitor circuits 40a, 40b, 40c, and 40d from the sensor detection circuit 10a is a known circuit which has been heretofore used as a sensor detection circuit. Therefore the sensor detection circuit 10a can be easily provided with the function of detecting the failure by adding only the monitor circuits 40a, 40b, 40c, and 40d to such a known sensor detection circuit and, therefore, realized within a short designing period, at low designing cost, and so on. Moreover, when the detection of acceleration is performed, the other configuration of the acceleration sensor according to the invention is entirely the same as that of the conventional acceleration sensor shown in FIG. 1, which offers an advantage in that the replacement of conventional acceleration sensors can be made easily.

In the acceleration sensor according to Embodiment 2, the configuration in which two output terminals, i.e., a first sensor output terminal 5a and a second sensor output terminal 5b are provided have been shown; however, the invention is not limited thereto and a configuration may be used in which only either of the two is provided.

Incidentally, since the other configuration of the acceleration sensor according to Embodiment 2 is the same as the configuration of the acceleration sensor according to Embodiment 1, the corresponding components are given the same reference numerals instead of thier detail explanation.

(Modification)

Figure 15:
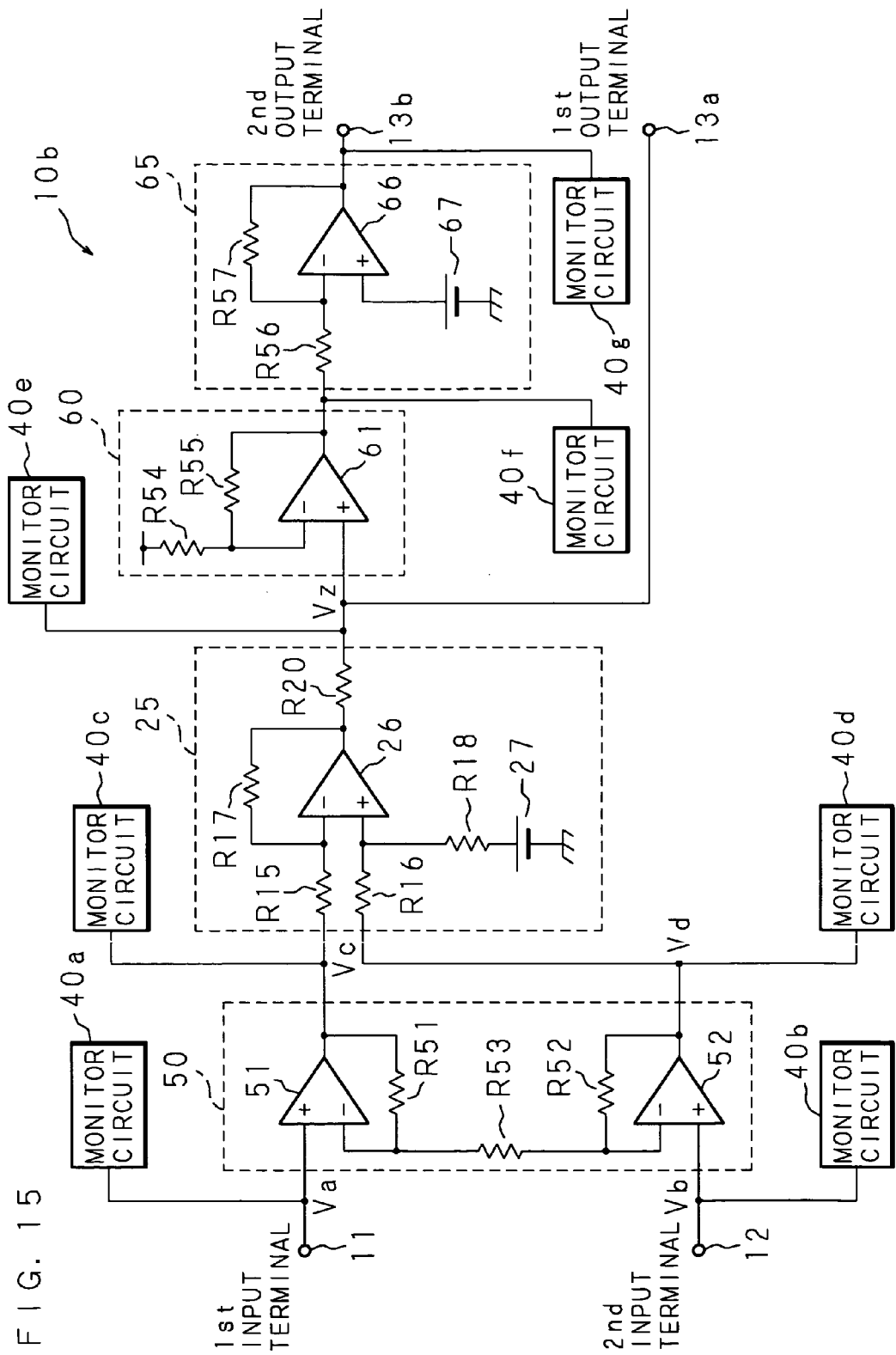
FIG. 15 is a circuit diagram showing a configuration of a sensor detection circuit according to a modification of Embodiment 2 of the invention.

FIG. 15 is a circuit diagram showing a configuration of a sensor detection circuit according to a modification of Embodiment 2 of the invention. A sensor detection circuit 10b according to the modification is configured by further adding monitor circuits 40e, 40f, and 40g to the sensor detection circuit 1a shown in FIG. 14.

The monitor circuit 40e is connected between the resistor R20 of the output stage differential amplifier 25 and the non-inverting input terminal of the operational amplifier 61 of the non-inverting amplifier 60, and monitors the potential of an output signal of the output stage differential amplifier 25. The monitor circuit 40f is connected between the output terminal of the operational amplifier 61 of the non-inverting amplifier 60 and the resistor R56 of the inverting amplifier 65, and monitors the potential of an output signal of the non-inverting amplifier 60. The monitor circuit 40g is connected between the output terminal of the operational amplifier 66 of the inverting amplifier 65 and the second output terminal 13b of the sensor detection circuit 10b, and monitors the potential of an output signal of the inverting amplifier 65.

By providing the monitor circuits 40e, 40f, and 40g, even when failure has occurred at the output stage differential amplifier 25, the non-inverting amplifier 60, and the inverting amplifier 65, the failure can be detected. In addition, through combinations of the monitor circuits which have detected abnormality, it is possible to specify which amplifier the failure has occurred at.

For example, when the monitor circuits 40c and 40d have not detected abnormality, but the monitor circuit 40e has detected abnormality, it is possible to specify that failure has occurred at the output stage differential amplifier 25. Likewise, when the monitor circuit 40e has not detected abnormality, but the monitor circuit 40f has detected abnormality, it is possible to specify that failure has occurred at the non-inverting amplifier 60. Moreover, when the monitor circuit 40f has not detected abnormality, but the monitor circuit 40g has detected abnormality, it is possible to specify that failure has occurred at the inverting amplifier 65.

Through such a configuration, it is possible not only to detect failure having occurred at the sensor element 100 and failure having occurred at the amplifiers in the sensor detection circuit 10b but also to specify points at which failure has occurred, which makes it possible to improve the reliability of the sensor further.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds there-of are therefore intended to be embraced by the claims.

The invention claimed is:

1. A sensor detection apparatus for detecting a state of a sensor element having a bridge circuit based on a potential difference between two output potentials of said bridge circuit outputted from said sensor element, comprising:

a first input terminal and a second input terminal to which the two output potentials outputted from said sensor element are inputted respectively;

a differential amplifying unit which amplifies the potentials of the input signals inputted to said first input terminal and said second input terminal, respectively, and outputs amplified results;

a monitoring unit for monitoring the potential of the input signal of said differential amplifying unit, and a monitoring unit for monitoring the potential of the output signal of said differential amplifying unit, wherein both monitoring units include a comparator that compares a potential to be monitored and a reference potential and then outputs a signal indicating a comparison result, and a control unit which detects the state of the sensor element based on monitor result by said monitoring unit.

2. The sensor detection apparatus as set forth in claim 1, wherein said differential amplifying unit includes: a first operational amplifier whose non-inverting input is connected with said first input terminal and whose output is connected with whose inverting input via a resistor; and a second operational amplifier whose non-inverting input is connected with said second input terminal and whose output is connected with an inverting input via a resistor; and the inverting input of said first operational amplifier and the inverting input of said second operational amplifier are connected with each other via a capacitor for cutting off the direct-current component.

3. The sensor detection apparatus as set forth in claim 2, wherein said first input terminal and said second input terminal are connected to said differential amplifying unit via a filter which cuts off the specific frequency component of the input signal, respectively.

4. The sensor detection apparatus as set forth in claim 1, wherein said differential amplifying unit outputs the two output signals generated by amplifying a potential difference between the two input signals, and said monitoring unit monitor the potentials of the two input signals and the two output signals, respectively.

5. The sensor detection apparatus as set forth in claim 4, further comprising an output stage differential amplifying unit which amplifies a potential difference between the two output signals of said differential amplifying unit, and outputs an amplified result.

6. The sensor detection apparatus as set forth in claim 5, further comprising driving means for generating a driving signal for driving said sensor element.

7. The sensor detection apparatus as set forth in claim 6, wherein said driving means generates a periodically changing driving signal or a direct-current driving signal.

8. The sensor detection apparatus as set forth in claim 6, wherein said driving means generates the driving signal which changes periodically, and conversion outputting means is provided for converting the periodically changing signal outputted from said output stage differential amplifying unit to a direct-current signal based on the periodically changing signal generated by said driving means, and for outputting the converted signal.

9. The sensor detection apparatus as set forth in claim 8, wherein said monitoring unit further includes: a counter which counts the output signal of said comparator; and said control unit detects the state of said sensor element based on count results by said counter.

10. The sensor detection apparatus sensor as set forth in claim 9, wherein said monitoring unit further includes a selecting unit which selects one of plural different reference potentials, and said comparator compares the potential to be monitored and the reference potential selected by said selecting unit, and output a signal indicating a comparison result.

11. A sensor characterized by comprising:

a sensor element which has a bridge circuit, and outputs two potentials of said bridge circuit; and a sensor detection apparatus for detecting a state of a sensor element based on a potential difference between two output potentials of said bridge circuit outputted from said sensor element;

said sensor detection apparatus including:

a first input terminal and a second input terminal to which the two output potentials outputted from said sensor elements are inputted, respectively;

a differential amplifying unit which amplifies the potentials of the input signals inputted to said first input terminal and said second input terminal, respectively, and outputs amplified results;

a monitoring unit for monitoring the potential of the input signal of said differential amplifying unit and a monitoring unit for monitoring the potential of the output signal of said differential amplifying unit, wherein both monitoring units include a comparator that compares a potential to be monitored and a reference potential and then outputs a signal indicating a comparison result, and a control unit which detects the state of the sensor element based on monitor result by said monitoring unit.

12. The sensor as set forth in claim 11, wherein said differential amplifying unit includes: a first operational amplifier whose non-inverting input is connected with said first input terminal and whose output is connected with whose inverting input via a resistor; and a second operational amplifier whose non-inverting input is connected with said second input terminal and whose output is connected with an inverting input via a resistor; and the inverting input of said first operational amplifier and the inverting input of said second operational amplifier are connected with each other via a capacitor for cutting off the direct-current component.

13. The sensor as set forth in claim 12, wherein said first input terminal and said second input terminal are connected to said differential amplifying unit via a filter which cuts off the specific frequency component of the input signal, respectively.

14. The sensors as set forth in claim 11, wherein said differential amplifying unit outputs the two output signals generated by amplifying a potential difference between the two input signals, and said monitoring unit monitor the potentials of the two input signals and the two outputs signals, respectively.

15. The sensor as set forth in claim 14, further comprising an output stage differential amplifying unit which amplifies a potential difference between the two output signals of said differential amplifying unit, and outputs an amplified result.

16. The sensor as set forth in claim 15, further comprising driving means for generating a driving signal for driving said sensor element.

17. The sensor as set forth in claim 16, wherein said driving means generates a periodically changing driving signal or a direct-current driving signal.

18. The sensor as set forth in claim 16, wherein
said driving means generates the driving signal which changes periodically, and
conversion outputting means is provided for converting the periodically changing signal outputted from said output stage differential amplifying unit to a direct-current signal based on the periodically changing signal generated by said driving means, and for outputting the converted signal.

19. The sensor as set forth in claim 18, wherein
said monitoring unit further includes: a counter which counts the output signal of said comparator; and
said control unit detects the state of said sensor element based on count results by said counter.

20. The sensor as set forth in claim 19, wherein
said monitoring unit further includes a selecting unit which selects one of plural different reference potentials, and
said comparator compares the potential to be monitored and the reference potential selected by said selecting unit, and outputs a signal indicating a comparison result.

* * * * *